United States Patent
Park et al.

(10) Patent No.: US 12,300,334 B2
(45) Date of Patent: *May 13, 2025

(54) NON-VOLATILE MEMORY DEVICE AND METHOD FOR PROGRAMMING A NON-VOLATILE MEMORY DEVICE

(71) Applicant: SAMSUNG ELECTRONICS CO., LTD., Suwon-si (KR)

(72) Inventors: Junyong Park, Seoul (KR); Hyunggon Kim, Hwaseong-si (KR); Byungsoo Kim, Yongin-si (KR); Sungmin Joe, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/400,297

(22) Filed: Dec. 29, 2023

(65) Prior Publication Data

US 2024/0145016 A1    May 2, 2024

Related U.S. Application Data

(63) Continuation of application No. 17/530,586, filed on Nov. 19, 2021, now Pat. No. 11,901,021.

(30) Foreign Application Priority Data

Nov. 19, 2020    (KR) .................... 10-2020-0155425

(51) Int. Cl.
    *G11C 16/04*    (2006.01)
    *G06F 3/06*    (2006.01)
    (Continued)

(52) U.S. Cl.
    CPC ........ *G11C 16/3459* (2013.01); *G06F 3/0604* (2013.01); *G06F 3/0655* (2013.01);
    (Continued)

(58) Field of Classification Search
    CPC ............ G11C 16/3459; G11C 11/5671; G11C 16/0483; G11C 16/08; G11C 16/10;
    (Continued)

(56) References Cited

U.S. PATENT DOCUMENTS 6,522,580 B2    2/2003    Chen et al.
7,269,068 B2    9/2007    Chae et al.
(Continued)

FOREIGN PATENT DOCUMENTS

KR    10-0645055    11/2006

*Primary Examiner* — Tha-O H Bui
(74) *Attorney, Agent, or Firm* — MORGAN, LEWIS & BOCKIUS LLP

(57) ABSTRACT

A method for programming at least one memory cell of a plurality of memory cells included in a non-volatile memory device, the at least one memory cell including a word line and a bit line, the method including: performing a first and second program and verify operation based on a first and second condition, respectively, wherein each program and verify operation includes generating a program voltage and a bit line voltage by a voltage generator included in the non-volatile memory device and providing the program voltage and the bit line voltage to the word line and the bit line, respectively, wherein voltage levels and voltage application times of each program voltage and bit line voltage correspond to the first condition or the second condition, respectively, wherein the first condition is different from the second condition.

19 Claims, 22 Drawing Sheets

(51) Int. Cl.
  *G11C 11/56*   (2006.01)
  *G11C 16/08*   (2006.01)
  *G11C 16/10*   (2006.01)
  *G11C 16/24*   (2006.01)
  *G11C 16/34*   (2006.01)
  *H10B 43/27*   (2023.01)

(52) U.S. Cl.
  CPC ........ *G06F 3/0679* (2013.01); *G11C 11/5671* (2013.01); *G11C 16/0483* (2013.01); *G11C 16/08* (2013.01); *G11C 16/10* (2013.01); *G11C 16/24* (2013.01); *H10B 43/27* (2023.02); *G11C 2211/5621* (2013.01)

(58) Field of Classification Search
  CPC ............ G11C 16/24; G11C 2211/5621; G11C 11/5628; G11C 16/0466; G11C 16/3427; G11C 16/32; G11C 16/3404; G11C 8/10; G11C 16/30; G06F 3/0604; G06F 3/0655; G06F 3/0679; H10B 43/27
  USPC .................................................. 365/185.03
  See application file for complete search history.

(56) References Cited

U.S. PATENT DOCUMENTS

| | | | |
|---|---|---|---|
| 7,486,561 B2 | 2/2009 | Mokhlesi | |
| 7,633,802 B2 | 12/2009 | Mokhlesi | |
| 7,672,166 B2 | 3/2010 | Park et al. | |
| 7,796,438 B2 | 9/2010 | Kim et al. | |
| 8,508,996 B2 | 8/2013 | Kim et al. | |
| 9,032,272 B2 | 5/2015 | Yoon et al. | |
| 9,343,141 B2 | 5/2016 | Pang et al. | |
| 9,953,703 B2 | 4/2018 | Hahn et al. | |
| 11,901,021 B2 * | 2/2024 | Park | G11C 16/3427 |
| 2016/0240264 A1 | 8/2016 | Hosono | |
| 2018/0374552 A1 | 12/2018 | Hong | |
| 2020/0357469 A1 | 11/2020 | Joe | |
| 2022/0101923 A1 * | 3/2022 | Park | G11C 16/10 |
| 2022/0157393 A1 | 5/2022 | Park et al. | |

* cited by examiner

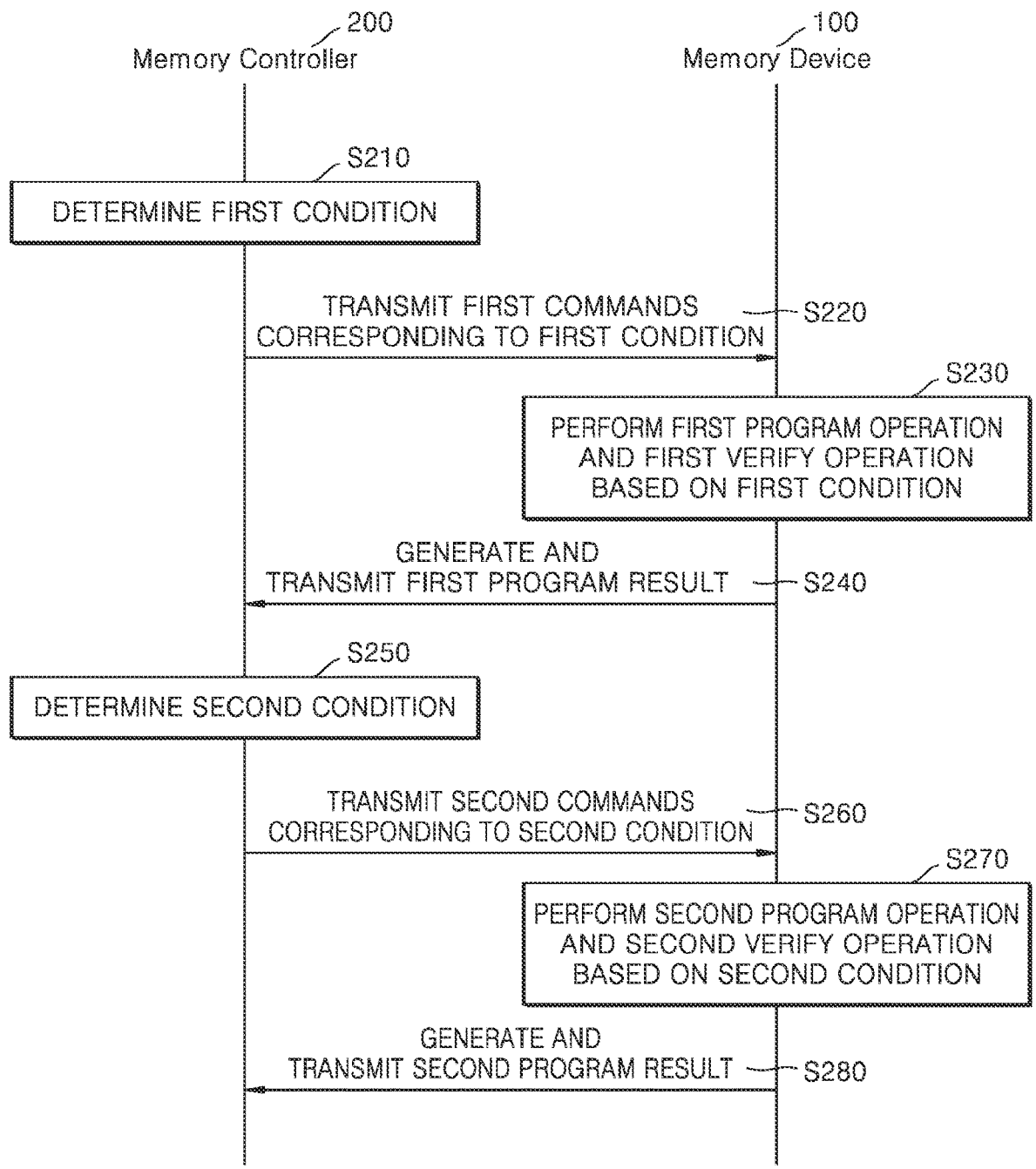

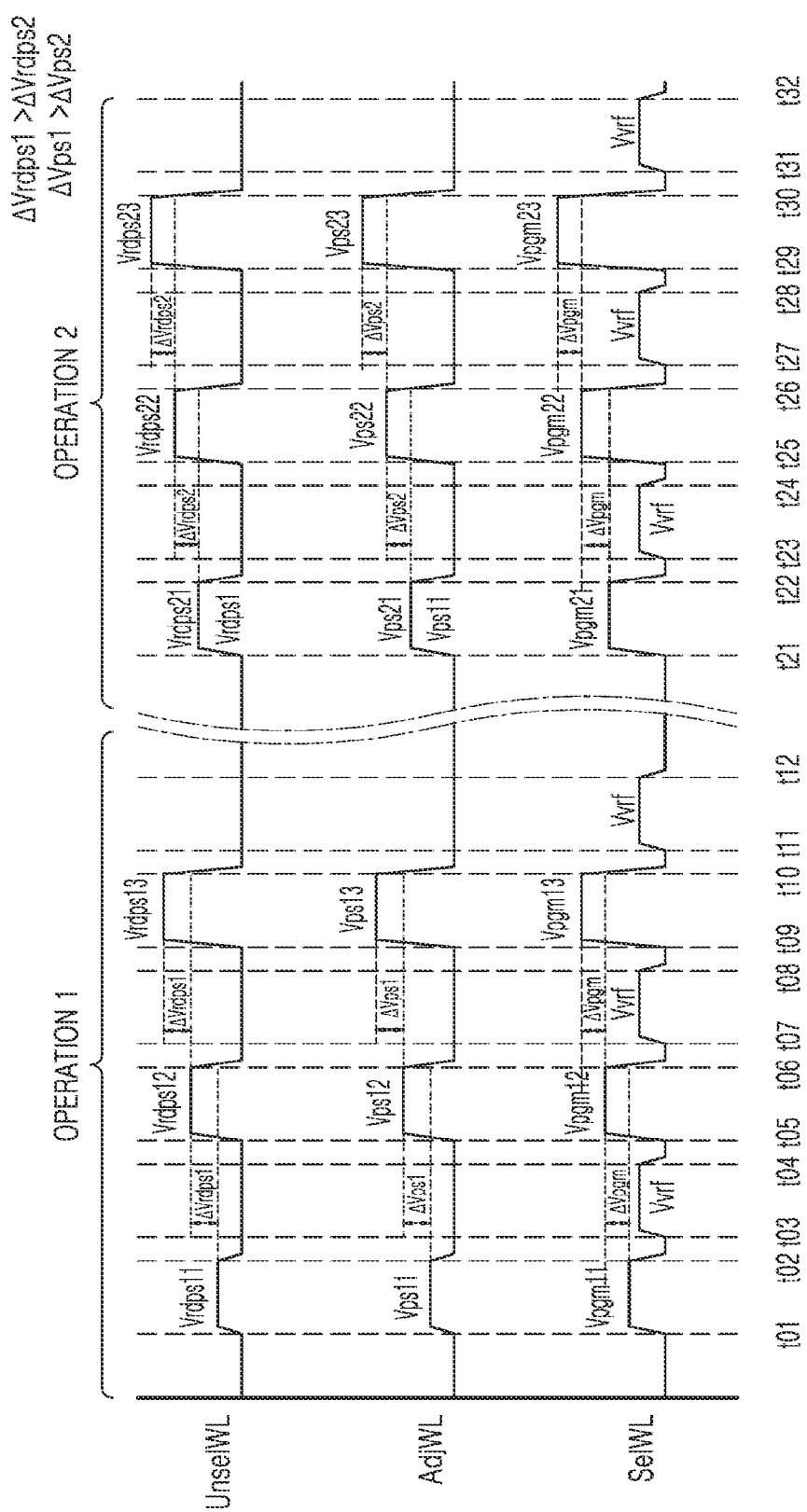

NON-VOLATILE MEMORY DEVICE AND METHOD FOR PROGRAMMING A NON-VOLATILE MEMORY DEVICE

CROSS-REFERENCE TO RELATED APPLICATIONS

The present application is a continuation application of U.S. patent application Ser. No. 17/530,586, filed on Nov. 19, 2021, which claims priority under 35 U.S.C. § 119 to Korean Patent Application No. 10-2020-0155425, filed on Nov. 19, 2020, in the Korean Intellectual Property Office, the disclosure of which is incorporated by reference herein in its entirety.

TECHNICAL FIELD

The inventive concept relates to a memory device with improved threshold voltage distribution and a programming method thereof, and more particularly, a non-volatile memory device that performs a first program operation and a second program operation based on different conditions, and a programming method thereof.

DISCUSSION OF THE RELATED ART

Memory devices may be used to store data and may be generally categorized as volatile memory devices and non-volatile memory devices. Compared to a volatile memory device, a non-volatile memory device may retain stored data even when its power supply is interrupted. Flash memory is a kind of non-volatile memory, and devices including flash memory may be used in mobile electronic devices such as cellular phones, stationary electronic devices such as computers, and auxiliary storage devices that may support mobile electronic devices and stationary electronic devices.

An increased demand for highly optimized integration of flash memory devices has led to the replacement, in some instances, of conventional floating gate memory with charge trap flash (CTF) memory. CTF memory is a semiconductor memory technology that may store a single bit or in some configurations multiple bits in a single memory cell. A CTF memory cell may be programmed with a value by providing voltage signals to the memory cell and trapping charges in a charge-trapping layer. The charges trapped in the charge-trapping layer may correspond to a threshold voltage, which is compared against predetermined levels to determine the value of the bits stored in the memory cell. CTF memory cells may be especially suitable for use in 3D flash memory devices, such as 3D NAND or V-NAND devices, due to their relatively simple and compact structure. However, some charges, mostly shallowly trapped charges, may escape a charge-trapping layer of a CTF memory cell soon after it is programmed, which may cause threshold voltage drift, in which an actual threshold voltage of the memory cell is different than a programmed threshold voltage. The threshold voltages of the memory cells may stabilize after a brief period has elapsed. Additionally, threshold voltage drift in a given memory cell may be attributed to the presence of charges in memory cell array structure near the given memory cell. As the amount of charges in the memory cell array structure increases, threshold voltage distributions may become less predictable. Threshold voltage drift may reduce the reliability of a CTF memory device.

SUMMARY

The inventive concept provides a memory device with improved threshold voltage distribution and a programming method thereof, and more particularly, a non-volatile memory device that performs a first program operation and a second program operation based on different conditions, and a programming method thereof.

According to an embodiment of the inventive concept, there is provided a method for programming at least one selected memory cell of a plurality of memory cells included in a non-volatile memory device, the at least one selected memory cell including a selected word line and a selected bit line, the method including: performing a first program and verify operation based on a first condition, wherein the first program and verify operation includes generating a first program voltage and a first bit line voltage by a voltage generator included in the non-volatile memory device and providing the first program voltage and the first bit line voltage to the selected word line and the selected bit line, respectively, wherein voltage levels and voltage application times of the first program voltage and the first bit line voltage correspond to the first condition; and performing a second program and verify operation based on a second condition, wherein the second program and verify operation includes generating a second program voltage and a second bit line voltage by the voltage generator and providing the second program voltage and the second bit line voltage to the selected word line and the selected bit line, respectively, wherein voltage levels and voltage application times of the second program voltage and the second bit line voltage correspond to the second condition, wherein the first condition is different from the second condition, wherein the non-volatile memory device includes a memory cell region including a first metal pad and the plurality of memory cells, and a peripheral region including a second metal pad and the voltage generator, wherein the voltage generator is connected to the plurality of memory cells through the first metal pad and the second metal pad, and wherein the at least one selected memory cell is formed perpendicularly to a substrate included in the non-volatile memory device.

According to an embodiment of the inventive concept, there is provided a method for programming at least one selected memory cell of a plurality of memory cells included in a non-volatile memory device, each of the plurality of memory cells being connected to a word line of a plurality of word lines and a bit line of a plurality of bit lines, the non-volatile memory device including a memory cell region including a first metal pad and the plurality of memory cells and including a peripheral region including a second metal pad and a voltage generator connected to the plurality of memory cells through the first metal pad and the second metal pad, the method including: performing a first program operation based on a first condition, the first program operation including: generating a first bit line voltage, a first program voltage, a first adjacent voltage, and a first pass voltage by the voltage generator, wherein voltage levels and voltage application times of the first bit line voltage, program voltage, adjacent voltage, and pass voltage correspond to the first condition; and providing the first bit line voltage to a selected bit line connected to the at least one selected memory cell, providing the first program voltage to a selected word line connected to the at least one selected memory cell, providing the first adjacent voltage to word lines immediately adjacent to the selected word line, and providing the first pass voltage to word lines not immediately adjacent to the selected word line; performing a first verify operation based on the first condition, including generating a first verify voltage by the voltage generator and providing the first verify voltage to the selected word line; performing a second program operation based on a second condition, the second program operation including: generating a second bit line voltage, a second program voltage, a second adjacent voltage, and a second pass voltage by the voltage generator, wherein voltage levels and voltage application times of the second bit line voltage, program voltage, adjacent voltage, and pass voltage correspond to the second condition; and providing the second bit line voltage to the selected bit line, providing the second program voltage to the selected word line, providing the second adjacent voltage to the word lines immediately adjacent to the selected word line, and providing the second pass voltage to the word lines not immediately adjacent to the selected word line; and performing a second verify operation based on the second condition, including generating a second verify voltage by the voltage generator and providing the second verify voltage to the selected word line, wherein the first condition is different from the second condition, and wherein the at least one selected memory cell is formed perpendicularly to a substrate included in the non-volatile memory device.

According to another aspect of the inventive concept, a non-volatile memory device includes: a memory cell region including: a first metal pad; a substrate; a memory cell array comprising a plurality of memory cells formed perpendicularly to the substrate; a plurality of string select lines; and a plurality of word lines connected to the memory cells, wherein groups of the plurality of memory cells are arranged in a plurality of vertically stacked memory cell strings, wherein each memory cell string is connected to a string select line, and wherein each memory cell is connected to a word line; and a peripheral circuit region including: a second metal pad connected to the memory cell region through the first metal pad and the second metal pad; a control logic configured to control a first and second program operation for the memory cell array by determining a first condition corresponding to the first program operation and a second condition corresponding to the second program operation, the first condition being different from the second condition, and by generating and providing address signals corresponding to the string select lines and the word lines, the control logic including a program logic configured to control voltage levels or voltage application times of voltages corresponding to the first and second conditions; a voltage generator configured to generate a plurality voltages corresponding to the first and second conditions; and a row decoder configured to provide the plurality of voltages to the memory cell array via the string select lines and the word lines based on address signals provided by the control logic.

BRIEF DESCRIPTION OF THE DRAWINGS

The above and other features of the inventive concept will become more apparent by describing in detail embodiments thereof with reference to the accompanying drawings, in which:

FIGS. 3A, 3B, and 3C are flowcharts of methods according to embodiments of the inventive concept;

FIG. 9 is a timing diagram of signals provided to word lines of a memory device 100 according to an embodiment of the inventive concept;

Figure 1:
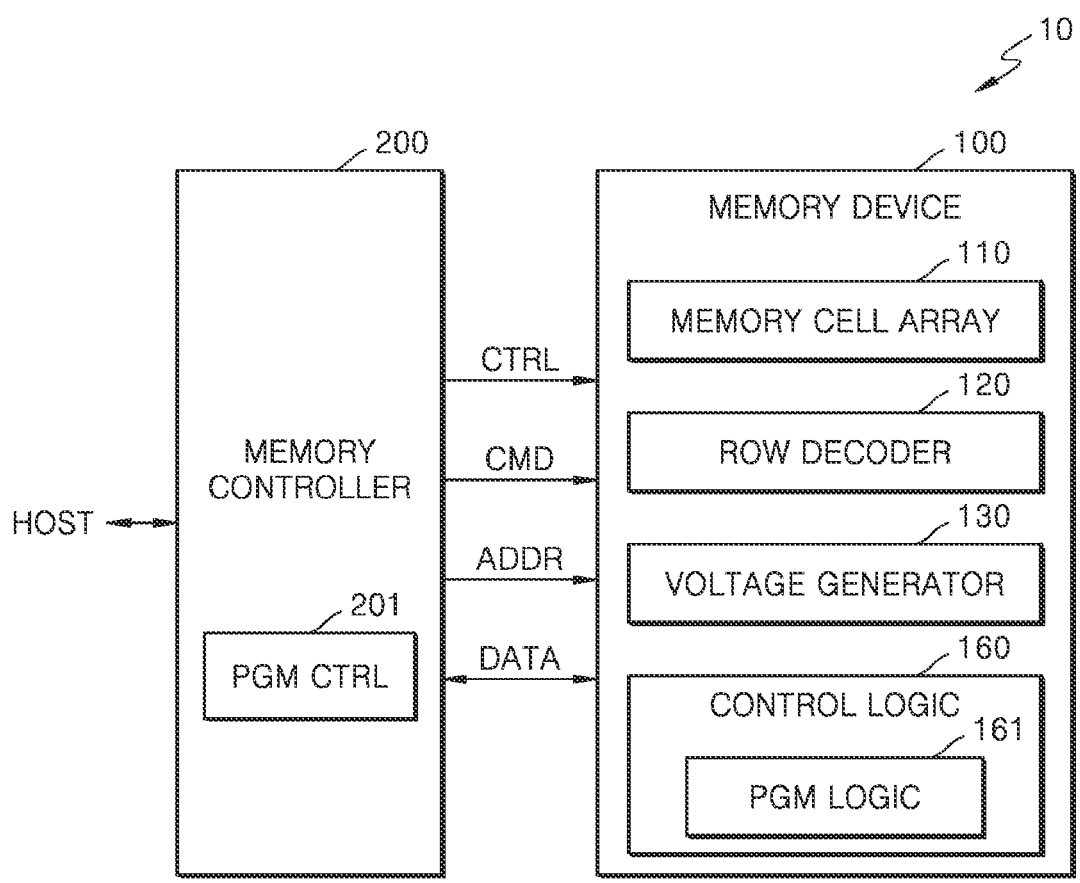
FIG. 1 is a block diagram of an electronic device 10 according to embodiments of the inventive concept.

It should be noted that these figures are intended to illustrate the general characteristics of methods, structure and/or materials utilized in certain embodiments and to supplement the written description provided below. These drawings are not, however, to scale and may not precisely reflect the precise structural or performance characteristics of any given embodiment, and should not be interpreted as defining or limiting the range of values or properties encompassed by exemplary embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Embodiments of the present inventive concept will be described more fully hereinafter with reference to the accompanying drawings. Like reference numerals may refer to like elements throughout the accompanying drawings.

FIG. 1 is a block diagram of an electronic device 10 according to embodiments of the inventive concept.

Referring to FIG. 1, the electronic device 10 may include a memory device 100 and a memory controller 200.

The electronic device 10 may correspond to a flash memory device including one or more flash memory chips.

In some embodiments, the electronic device 10 may be an embedded memory embedded in an electronic system. For example, the electronic device 10 may be an embedded multi-media card (eMMC) or an embedded universal flash storage (UFS) memory device. In some embodiments, the electronic device 10 may be an external memory that may be detachable from an electronic device. For example, the electronic device 10 may be a UFS memory card, a compact flash (CF) card, a secure digital (SD) card, a micro secure digital (SD) card, a mini secure digital (SD) card, an extreme digital (xD) card, or a memory stick.

In some embodiments, the electronic device 10 may include a flash memory. The flash memory may include a 2D NAND memory cell array or a 3D, or vertical, NAND memory cell array. A 3D NAND array may also be known as a V-NAND array. Detailed description of a 3D NAND memory cell array will be given below with reference to FIG. 5. The electronic device 10 may be implemented as, for example, a personal computer (PC), a data server, a network-attached storage (NAS), an Internet of Things (IoT) device, or a portable electronic device. The portable electronic device may be, but is not limited to, a device such as a laptop computer, a mobile phone, a smart phone, a tablet PC, a personal digital assistant (PDA), an enterprise digital assistant (EDA), a digital still camera, a digital video camera, an audio device, a portable multimedia player (PMP), a personal navigation device (PND), an MP3 player, a handheld game console, an e-book device, or a wearable device.

The memory device 100 may include a memory cell array 110, a row decoder 120, a voltage generator 130, and a control logic 160. The memory device 100 may receive various control signals CTRL, various command signals CMD, and various address signals ADDR from the memory controller 200 and may communicate data DATA with the memory controller 200. In an embodiment, the memory device 100 may program (i.e. write) data DATA after receiving a program command signal CMD, may read data DATA after receiving a read command signal CMD, and may erase data DATA after receiving an erase command signal CMD. In an embodiment, the memory device 100 may access a physical storage location (e.g., a memory cell in the memory cell array 110) in which data DATA is to be programmed, read from, or erased from based on an a received address signal ADDR. In an embodiment, the memory device 100 may generate a plurality of voltage signals and/or a plurality of logic signals for storing data DATA at a storage location (e.g., a memory cell in the memory cell array 110) based on a control signal CTRL. For example, the memory device 100 may generate a plurality of word line voltages and a bit line voltage as a plurality of voltage signals. Data DATA may correspond to a value of one or more bits, and the value may correspond to a threshold voltage.

The memory cell array 110 may include a plurality of memory cells. In an embodiment, the plurality of memory cells may be included in a plurality of memory pages included in the memory cell array 110. In an embodiment, the plurality of memory cells may be included in a plurality of memory blocks included in the memory cell array 110. In an embodiment, the plurality of memory pages may be included in the plurality of memory blocks included in the memory cell array 110. In embodiments, the memory cells may be magnetic RAM (MRAM) cells, spin-transfer torque MRAM cells, conductive bridging RAM (CBRAM) cells, ferroelectric RAM (FeRAM) cells, phase RAM (PRAM) cells, resistive RAM cells, flash memory cells, or various other types of non-volatile memory cells. Hereinafter, embodiments of the inventive concept in which the plurality of memory cells are NAND flash memory cells and the memory device 100 is a CTF memory device will be described in detail.

The row decoder 120 may provide a plurality of voltage signals to the memory cell array 110 based on a plurality of voltage signals generated by and received from the voltage generator 130. In an embodiment, the row decoder 120 may provide a plurality of voltage signals to a memory cell in the memory cell array 110 based on an address signal ADDR.

The control logic 160 may control the memory device 100 based on a control signal CTRL, an address signal ADDR, and a command signal CMD. In an embodiment, the command signal CMD may instruct the control logic 160 to initiate and control a particular operation, such as a program operation, a verify operation, a read operation, or an erase operation, to be performed by the memory device 100. In an embodiment, the control logic 160 may generate and provide a voltage control signal to the voltage generator 130 in response to the control signal CTRL, and the voltage generator 130 may generate a plurality of voltage signals in response. In an embodiment, in response to the address signal ADDR, the control logic 160 may select at least one memory cell in the memory cell array 110 by selecting a row and a column of the memory cell array 110 in which the selected memory cell is included. The control logic 160 may select various lines connected to the at least one selected memory cell, such as a word line and a bit line. The control logic 160 may generate a row address signal corresponding to the selected row and may provide the row address signal to the row decoder 120. The control logic 160 may generate a column address corresponding to the selected column and may provide the column address to another component of the memory device 100, such as a page buffer.

The control logic 160 may include a program logic 161. According to an embodiment, the program logic 161 may control a first program operation and a second program operation performed by the memory device 100 for at least one memory cell in the memory cell array 110. In an embodiment, the second program operation may be performed after a sufficient time has elapsed from the performance of the first program operation. Doing so may result in an improved threshold voltage distribution that may account for threshold voltage drift after the first program operation is performed. The first program operation and the second program operation according to embodiments of the inventive concept will be described in further detail below with reference to accompanying drawings.

According to an embodiment, the program logic 161 may control program operations for the memory cell array 110 such that data is programmed to a plurality of memory blocks according to a block interleaving programming method. The block interleaving programming method is a method of performing a first program operation for memory cells connected to a selected word line of a first memory block, performing a first program operation for memory cells connected to a selected word line of a second memory block, performing a second program operation for the memory cells connected to the selected word line of the first memory block, performing a second program operation for the memory cells connected to the selected word line of the second memory block, and so on. However, a programming method applied by the program logic 161 is not limited thereto, and various programming methods that combine program operations for a plurality of memory blocks and a plurality of word lines in various ways may be applied.

According to an embodiment, the program logic 161 may control a first and second verify operation performed by the memory device 100 to verify programmed states of at least one selected memory cell in the memory cell array 110 by generating and providing verify voltages corresponding to target programmed states. The program logic 161 may generate and provide a program result corresponding to a programmed state of the at least one selected memory cell after each program and verify operation. While embodiments of the inventive concept may be described in terms of a first program operation, a first verify operation, a second program operation, and a second verify operation, the inventive concept is not limited thereto. For example, one or more program and verify operations may be performed. In an embodiment, each program operation and verify operation may be performed successively. In an embodiment, each program operation and verify operation, such as a first program operation and a first verify operation, may be performed concurrently, such as a first program and verify operation. In an embodiment, each program operation and verify operation may be performed as a looping operation including multiple program loop operations and verify loop operations.

According to an embodiment of the inventive concept, the program logic 161 may control a first condition for performing the first program operation and the first verify operation, and may control a second condition for performing the second program operation and the second verify operation. The first condition may be different from the second condition. For example, the program logic 161 may control a first condition, including a first voltage level and a first voltage application time, for performing the first program operation, and may control a different second condition, including a second voltage level and a second voltage application time, for performing the second program operation. For example, the program logic 161 may adjust signals generated by the control logic 160 by controlling the first and second conditions, such that voltage levels of a plurality of word line voltages during the second program operation are higher than voltage levels of a plurality of word line voltages during the first program operation. For example, the program logic 161 may adjust the level of a verify voltage by controlling the first and second conditions, such that a level of a verify voltage during the second verify operation may be different from a level of a verify voltage during the first verify operation.

According to the inventive concept, then, by controlling different conditions for each program operation and verify operation, threshold voltage distributions of programmed memory cells may be enhanced, and the reliability of the program operation and the memory device 100 may be improved. The operation conditions will be described in further detail below with reference to the accompanying drawings.

The program logic 161 may be implemented as a hardware processing circuit, such as hardware including logic circuits, as a software processing circuit, or as a combination hardware/software processing circuit, such as a processor that executes software for performing a program operation on memory cells. In particular, the processing circuit may be implemented by a CPU; an arithmetic logic unit (ALU) that may perform arithmetic and logic operations, bit shifting, etc.; a digital signal processor (DSP); a microprocessor; or an application specific integrated circuit (ASIC). However, the inventive concept is not limited thereto.

Although the accompanying drawings illustrate that the program logic 161 may be included in the control logic 160, the inventive concept is not limited thereto. For example, functions performed by the program logic 161 may be performed by the control logic 160, by the memory controller 200, or by a program controller 201. For example, the program logic 161 may be included in the memory controller 200. For example, functions performed by the control logic 160 may be performed by the program logic 161. The memory device 100 will be described in detail below with reference to FIG. 2.

The memory controller 200 may control the memory device 100 to read data stored in the memory device 100 or program data to the memory device 100 in response to a read/write request from a host HOST, and may control the memory device 100 to erase data stored in the memory device 100 in response to an erase request from the host HOST. For example, the memory controller 200 may determine operation conditions for operations performed by the memory device 100. For example, the memory controller 200 may provide a command signal CMD, an address signal ADDR, and a control signal CTRL corresponding to the operation conditions to the memory device 100, thereby controlling a program operation, a read operation, and an erase operation for the memory device 100. Data DATA, including data to be programmed and read data, may be transmitted and received between the memory controller 200 and the memory device 100.

The memory controller 200 may include the program controller 201. The program controller 201 may control the memory device 100 by generating and providing the first condition and the second condition to the memory device 100. In an embodiment, a condition may be generated by the memory controller 200 based on a program result received from the memory device 100. In an embodiment, a condition may be predetermined and stored by the memory controller 200. Although the accompanying drawings illustrate the program controller 201 to be included in the memory controller 200, the inventive concept is not limited thereto. For example, functions performed by the program controller 201 may be performed by the memory controller 200, may be performed by the memory device 100 (e.g., by the control logic 160 or the program logic 161), or may be performed by both the memory controller 200 and the memory device 100. For example, the program controller 201 may be included in the memory device 100. For example, functions performed by the memory controller 200 may be performed by the program controller 201, or may be performed by the memory device 100 (e.g., by the control logic 160 or the program logic 161).

The host HOST may perform various operations to process commands received from a user of the host HOST and may provide an operation result to the user. The host HOST may include hardware, such as an electronic device, or software, such as an operating system or an application. According to an embodiment, the host HOST may include a UFS host control driver for supporting a UFS protocol. However, the inventive concept is not limited thereto, and the host HOST may include a driver for supporting an embedded multimedia card (eMMC) protocol or a nonvolatile memory express (NVMe) protocol.

Figure 2:
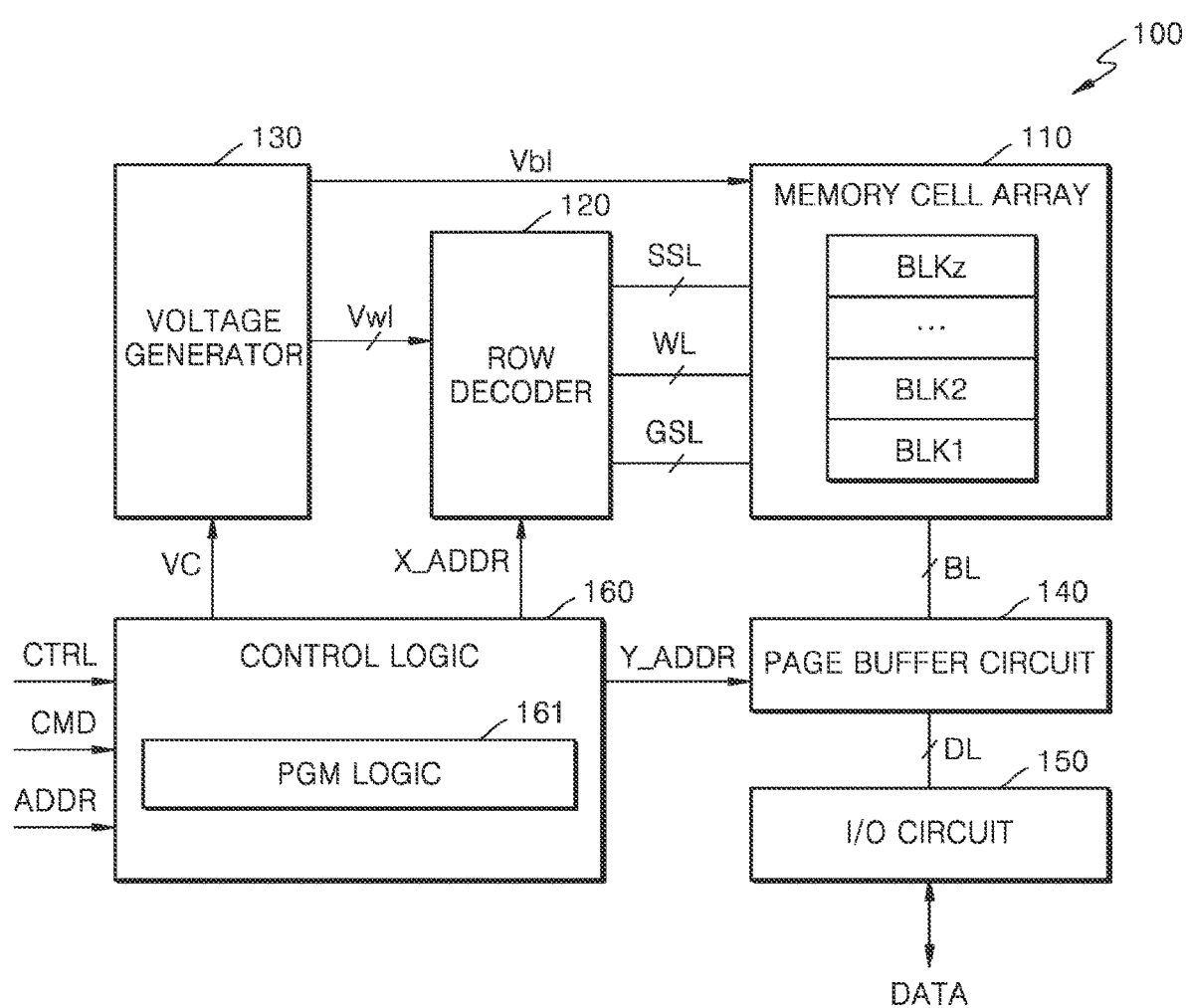
FIG. 2 is a detailed block diagram of a memory device 100 of FIG. 1 according to embodiments of the inventive concept.

FIG. 2 is a detailed block diagram of a memory device 100 of FIG. 1 according to embodiments of the inventive concept.

Referring to FIG. 2, the memory device 100 may include the memory cell array 110, the row decoder 120, the voltage generator 130, a page buffer circuit 140, an input/output circuit 150, and the control logic 160, and the control logic 160 may include the program logic 161. The memory device 100 may further include an input/output interface.

The memory cell array 110 may be connected to the row decoder 120 through a plurality of word lines WL, a plurality of string select lines SSL, and a plurality of ground select lines GSL, and may be connected to the page buffer circuit 140 through a plurality of bit lines BL. The memory cell array 110 may include a plurality of memory blocks BLK1 to BLKz, and the memory blocks BLK1 to BLKz may each include a plurality of memory cells. Each memory cell may store one or more bits, and more particularly, each memory cell may be used as a single-level cell (SLC), a multi-level cell (MLC) (i.e. a cell that may store two bits), a triple level cell (TLC) (i.e. a cell that may store three bits), a quadruple level cell (QLC) (i.e. a cell that may store four bits), or a memory cell that may store more than four bits. In an embodiment, some memory blocks BLK1 to BLKz may be SLC blocks and other memory blocks BLK1 to BLKz may be MLC blocks, TLC blocks, etc. The memory blocks BLK1 to BLKz will be described in further detail below with reference to the accompanying drawings.

A group of memory cells in the memory cell array 110 connected to each other in series, to a string select line SSL, and to a bit line BL may be referred to as a memory cell string. A memory cell string according to embodiments will be described in further detail below with reference to FIGS. 5 and 15.

The row decoder 120 may provide a plurality of signals to the memory cell array 110 through the plurality of word lines WL, the plurality of string select lines SSL, and the plurality of ground select lines GSL. The row decoder may direct the plurality of signals to connected lines based on row address signals X_ADDR received from the control logic 160. The row decoder 120 may provide a plurality of word line voltages Vwl received from the voltage generator 130 to the word lines WL.

According to an embodiment, the plurality of word line voltages Vwl may include a program voltage, an adjacent voltage, a pass voltage, etc. For example, a program voltage may be a voltage signal provided through a selected word line WL to a selected row of memory cells in the memory cell array 110 for setting memory cells included in the row of memory cells to a programmable state, an adjacent voltage may be a voltage signal provided through word lines of the plurality of word lines WL immediately adjacent to the selected word line, and a pass voltage may be a voltage provided to word lines of the plurality of word lines WL not immediately adjacent to the selected word line. The program voltage, the adjacent voltage, and the pass voltage may each have different voltage levels and voltage application times from one another.

The voltage generator 130 may generate a plurality of voltage signals to be provided to the memory cell array 110. In an embodiment, the voltage generator 130 may generate the voltage signals for operating the memory device 100 by receiving a voltage control signal VC from the control logic 160. For example, the voltage generator 130 may generate voltage signals (e.g., a program voltage, an adjacent voltage, and a pass voltage) for programming data to at least one memory cell in the memory cell array 110 based on a voltage control signal VC corresponding to a program command CMD. Similarly, the voltage generator 130 may generate voltage signals (e.g., a read voltage, a pass voltage, and a ground voltage) for reading data from at least one memory cell in the memory cell array 110 based on a voltage control signal VC corresponding to a read command CMD Similarly, the voltage generator 130 may generate voltage signals (e.g., an erase voltage) for erasing data written in at least one memory cell in the memory cell array 110 based on a voltage control signal VC corresponding to an erase command CMD.

According to an embodiment of the inventive concept, the voltage generator 130 may generate a bit line voltage Vbl. For example, the bit line voltage Vbl may correspond to a programmed threshold voltage of a memory cell in the memory cell array 110 that is in a programmable state. Although the accompanying drawings illustrate that the bit line voltage Vbl is directly provided to the memory cell array 110 by the voltage generator 130, the inventive concept is not limited thereto. For example, the bit line voltage Vbl may be provided indirectly to the memory cell array 110 through the row decoder 120, or may be provided indirectly to the memory cell array 110 through the page buffer circuit 140 and the connected plurality of bit lines BL. In other words, the bit line voltage Vbl may be provided to bit lines BL connected to the memory cell array 110 according to various circuit design schemes.

The page buffer circuit 140 may include a plurality of page buffers, and each page buffer may include a sense latch, a data latch, and a cache latch. In an embodiment, each page buffer may be connected to one bit line BL. In an embodiment, each page buffer may be connected to a group of bit lines of the plurality of bit lines BL.

The page buffer circuit 140 may provide a bit line voltage Vbl to a selected bit line of the plurality of bit lines BL based on a column address Y_ADDR. Therefore, the page buffer circuit 140 may operate as a write driver or a sense amplifier, depending on a particular operation being performed by the memory device 100. During a program operation, the page buffer circuit 140 may provide a bit line voltage Vbl through a selected bit line BL connected to a selected column of memory cells in the memory cell array 110 corresponding to a threshold voltage and data DATA, to be programmed to at least one selected memory cell in the selected column. During a read operation, such as a sequential read operation or a random read operation, the page buffer circuit 140 may sense data DATA stored in at least one selected memory cell through the bit line BL. The page buffer circuit 140 may latch the sensed data. In an embodiment, the page buffer circuit 140 may transmit the sensed data to the input/output circuit 150 through a plurality of data lines DL. The page buffer circuit 140 will be described in further detail below with reference to FIG. 10. The input/output circuit 150 may output sensed data or latched data DATA, for example, to the memory controller 200.

The control logic 160 may output various control signals for programming data DATA to or reading or erasing data DAT from memory cells in the memory based on a command signal CMD, an address signal ADDR, and a control signal CTRL. According to an embodiment, the control logic 160 may control various operations performed by the memory device 100. In an embodiment, the control logic 160 may generate and provide a voltage control signal VC, a row address signal X_ADDR, and a column address signal Y_ADDR for performing a memory page-by-memory page read or program operation and a memory block-by-memory block erase operation.

The program logic 161 may generate a plurality of signals to perform at least one program operation for programming (i.e. writing) data DATA to a memory cell. According to an embodiment, the memory device 100 may program data DATA to at least one selected memory cell in a programmable state through a first program operation controlled by the program logic 161. According to an embodiment, the program logic 161 may control and the memory device 100 may perform a second program operation that may mitigate the effect on a threshold voltage distribution caused by electron loss from a charge trapping layer of the at least one selected memory cell.

The program logic 161 may generate a plurality of signals to control at least one verify operation performed by the memory device 100 for verifying a programmed state of the at least one selected memory cell after a program operation. According to an embodiment, the memory device 100 may perform a first verify operation after a first program operation based on the control of the program logic 161 and may perform a second verify operation after a second program operation based on the control of the program logic 161. However, the inventive concept is not limited thereto, and various program and verify operations may be performed as described above.

According to an embodiment of the inventive concept, the program logic 161 may control first conditions for signals generated and provided for performing the first program operation and the first verify operation, and may control second, different conditions for signals generated and provided for performing the second program operation. According to an embodiment of the inventive concept, conditions for a program operation and a verify operation may include a voltage level, voltage application time, etc. However, the inventive concept is not limited thereto, and various electrical variables for signals that may be provided through a line may be included in the conditions.

According to an embodiment of the inventive concept, the program logic 161 may adjust a voltage signal provided to a selected word line of the plurality of word lines WL connected to at least one selected memory cell in the memory cell array 110, word lines of the plurality of word lines WL immediately adjacent to the selected word line, and non-selected word lines of the plurality of word lines WL not immediately adjacent to the selected word line, and a selected bit line connected to the at least one selected memory cell. According to an embodiment of the inventive concept, the program logic 161 may adjust a voltage signal generated and provided during the first program operation to be different from a voltage signal generated and provided during the second program operation. According to an embodiment of the inventive concept, the program logic 161 may adjust a voltage signal generated and provided during the first verify operation to be different from a voltage signal generated and provided during the second verify operation.

In an embodiment, as a result of adjusting a voltage signal by the program logic 161, a voltage level during the first program operation may be different from a voltage level during the second program operation. In an embodiment, a voltage level during the first verify operation may be different from a voltage level during the second verify operation. In an embodiment, a voltage application time during the first verify operation may be different from a voltage application time during the second verify operation. In an embodiment, a bit line to which a voltage is provided during the first program operation and the first verify operation may be different from a bit line to which a voltage is provided during the second program operation and the second verify operation.

As the program logic 161 may control different first and second conditions for performing at least a first program and verify operation and a second program and verify operation, respectively, a threshold voltage distribution for programmed memory cells may be improved over instances in which memory cells are reprogrammed under the same conditions. Program and verify operations according to embodiments of the inventive concept will be described in further detail below with reference to FIGS. 9 to 16.

Figure 3A:
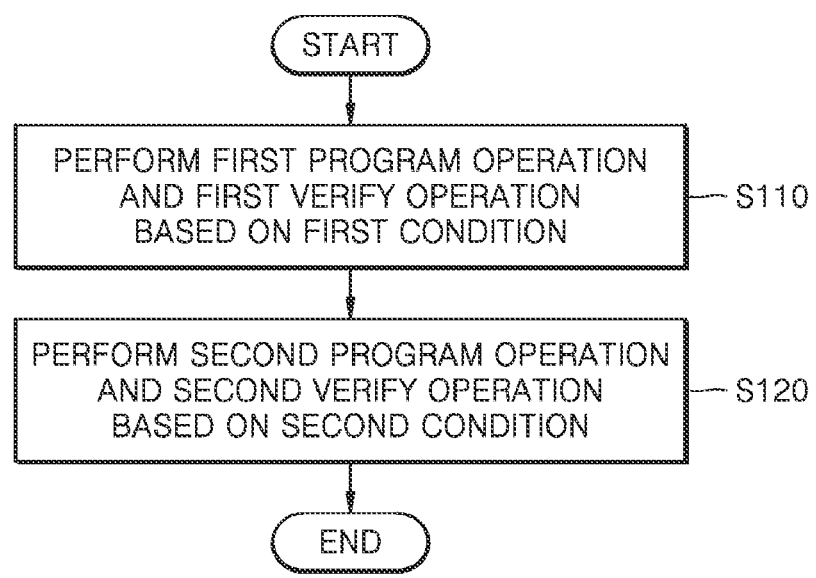
Figure 3B:
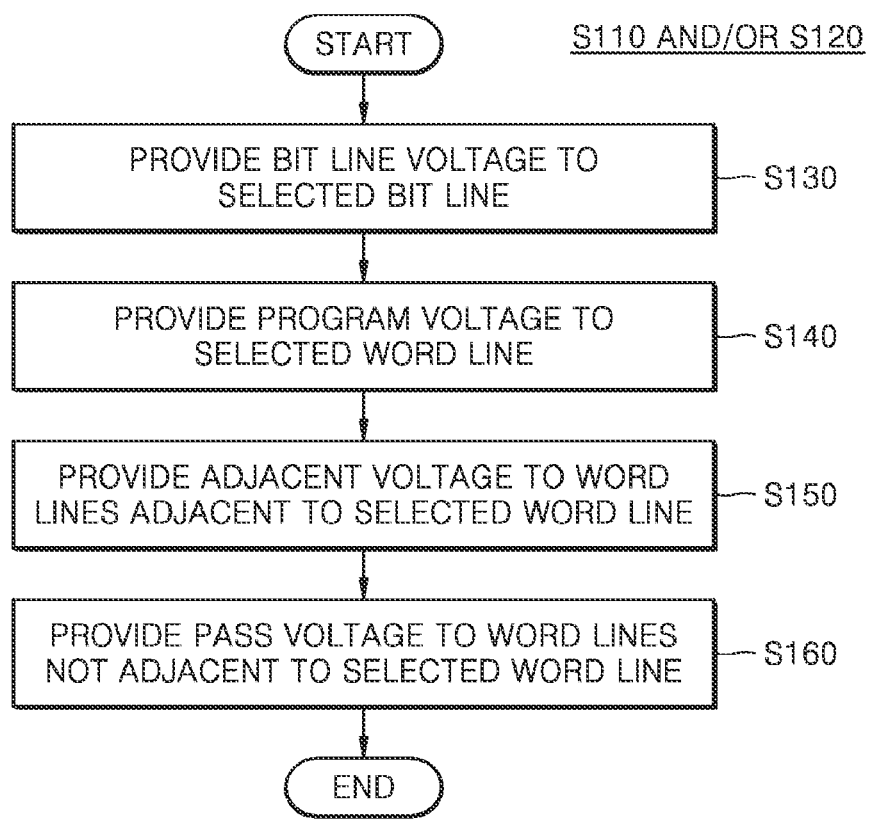

FIGS. 3A, 3B, and 3C are flowcharts of methods according to embodiments of the inventive concept.

Referring to FIG. 3A, a memory device 100 may perform a first program operation and a first verify operation based on a first condition (S110). The first condition may correspond to first electrical variables.

The memory device 100 may perform a second program operation and a second verify operation based on a second condition (S120). The second condition may correspond to second electrical variables and may be different from the first condition.

According to an embodiment of the inventive concept, a level of a voltage signal and/or an application time of a voltage are electrical variables that may vary according to the first condition and the second condition.

Referring to FIG. 3B, a method of performing program operations of steps S110 and/or S120 is shown in detail.

During the program operations, a bit line voltage Vbl may be provided to a selected bit line of the plurality of bit lines BL connected to at least one selected memory cell in the memory cell array 110 (S130). In an embodiment, the selected bit line and the at least one selected memory cell may be selected by the control logic 160. In an embodiment, the bit line voltage Vbl may be a signal for programming data DATA to the at least one selected memory cell. In an embodiment, the bit line voltage Vbl may be generated by a voltage generator 130 and may be provided to the at least one selected memory cell through a bit line BL. The bit line voltage Vbl may be directly provided by the voltage generator 130 or may be provided through a page buffer in a page buffer circuit 140.

A program voltage may be provided to a selected word line of the plurality of word lines WL to which at least one selected memory cell in the memory cell array 110 is connected (S140). In an embodiment, the program voltage may be a signal for setting the at least one selected memory cell to a programmable state. In an embodiment, the program voltage may be generated by a voltage generator 130. In an embodiment, the selected word line may be selected by the control logic 160.

An adjacent voltage may be provided to word lines of the plurality of word lines WL immediately adjacent to the selected word line ("adjacent word lines") (S150). In an embodiment, the adjacent voltage may be a signal for preventing interference with the program operation based on a voltage difference between the adjacent word lines and the selected word line. In an embodiment, the adjacent voltage may be generated by a voltage generator (130 of FIG. 2).

A pass voltage may be applied to word lines of the plurality of word lines WL not immediately adjacent to the selected word line ("non-selected word lines") (S160). In an embodiment, the pass voltage may be a signal for preventing interference with the program operation based on a voltage difference between each of the selected word line, the adjacent word lines, and the non-selected word lines. According to an embodiment, the pass voltage may be equal to or different than the adjacent voltage. In an embodiment, the pass voltage may be generated by a voltage generator 130.

Embodiments of the method shown in FIG. 3B are not limited to the illustrated order of operations. For example, in embodiments, the order of operations may be freely changed or may be performed within substantially the same period.

FIG. 3C illustrates a method according to embodiments of the inventive concept.

The memory controller 200 may determine a first condition (S210). The memory controller 200 may provide the memory device 100 with the first condition by transmitting a first program command CMD and a first verify command CMD corresponding to the first condition to the memory device 100 (S220). According to an embodiment, the memory device 100 may be implemented as a non-volatile memory (NVM) device.

The memory device 100 may perform a first program operation and a first verify operation based on the first condition (S230). For example, the memory device 100 may program at least one selected memory cell in the memory cell array 110 with first data DATA corresponding to a predetermined first voltage level and a determined first voltage application time based on the first condition during the first program operation and may verify a first programmed state of the at least one selected memory cell. The memory device 100 may generate and transmit a first program result corresponding to the first programmed state of the at least one selected memory cell to the memory controller 200 (S240).

The memory controller 200 may determine a second condition based on the first program result (S250). The second condition may be different than the first condition. For example, based on the first program result, the second condition may correspond a desired adjustment of the programmed state of the at least one selected memory cell. For example, the second condition may correspond to a desired change in a threshold voltage of the at least one selected memory cell indicated by the first program result. However, the inventive concept is not limited thereto. For example, in an embodiment, the memory controller 200 may store a plurality of predetermined conditions independent of a given program result. The memory controller 200 may provide the memory device 100 with the second condition by transmitting a second program command CMD and a second verify command CMD corresponding to the second condition to the memory device 100 (S260).

The memory device 100 may perform a second program operation and a second verify operation based on the second condition (S270). For example, the memory device 100 may program the at least one selected memory cell with second data DATA corresponding to a predetermined second voltage level and a predetermined second voltage application time based on the second condition and may verify a second programmed state of the at least one selected memory cell. The memory device 100 may generate and transmit a second program result corresponding to the second programmed state of the at least one selected memory cell, including a second threshold voltage of the at least one selected memory cell (S280).

Thus, by reprogramming the at least one selected memory cell under a condition different from a condition it was previously programmed under, threshold voltage drift may be compensated for and a threshold voltage distribution may be improved.

Figure 4:
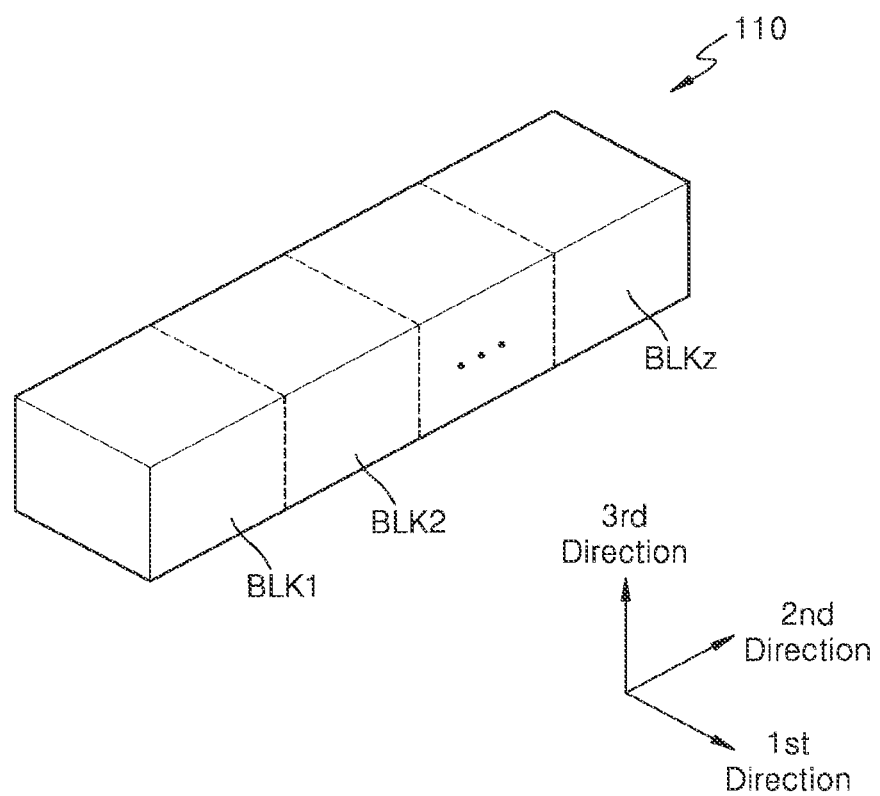
FIG. 4 is a diagram of a memory cell array 110 of FIG. 2 according to an embodiment of the inventive concept.

FIG. 4 is a diagram of a memory cell array 110 of FIG. 2 according to an embodiment of the inventive concept. Referring to FIG. 4, the memory cell array 110 may include the memory blocks BLK1 to BLKz, and each memory block BLK1 to BLKz may have a three-dimensional structure. Therefore, the memory cell array 110 may be referred to as a three-dimensional memory cell array.

In an embodiment, a three-dimensional memory cell array may include memory cells which may be arranged on a silicon substrate and may have active regions or a circuit related to operations of the included memory cells. The three-dimensional memory cell array may be monolithically formed on the substrate or may be formed in at least one physical level of a circuit formed in the substrate. The term "monolithic" may indicate that a plurality of layers constituting the three-dimensional memory cell array may be stacked directly on each other.

In an embodiment, the three-dimensional memory cell array may include a plurality of NAND strings, in which a plurality of memory cells may be vertically stacked. In an embodiment, a memory cell in the memory cell array 110 may include a charge trapping layer. U.S. Pat. Nos. 7,679,133, 8,553,466, 8,654,587, 8,559,235, and U.S. Patent Application Publication No. 2011/0233648 disclose configurations of three-dimensional memory cell arrays, including configurations in which word lines and or/bit lines are connected to multiple layers of the three-dimensional memory cell arrays, and each of their disclosures are incorporated by reference herein in their entirety. These configurations are suitable configurations for embodiments of the memory cell array 110.

Figure 5:
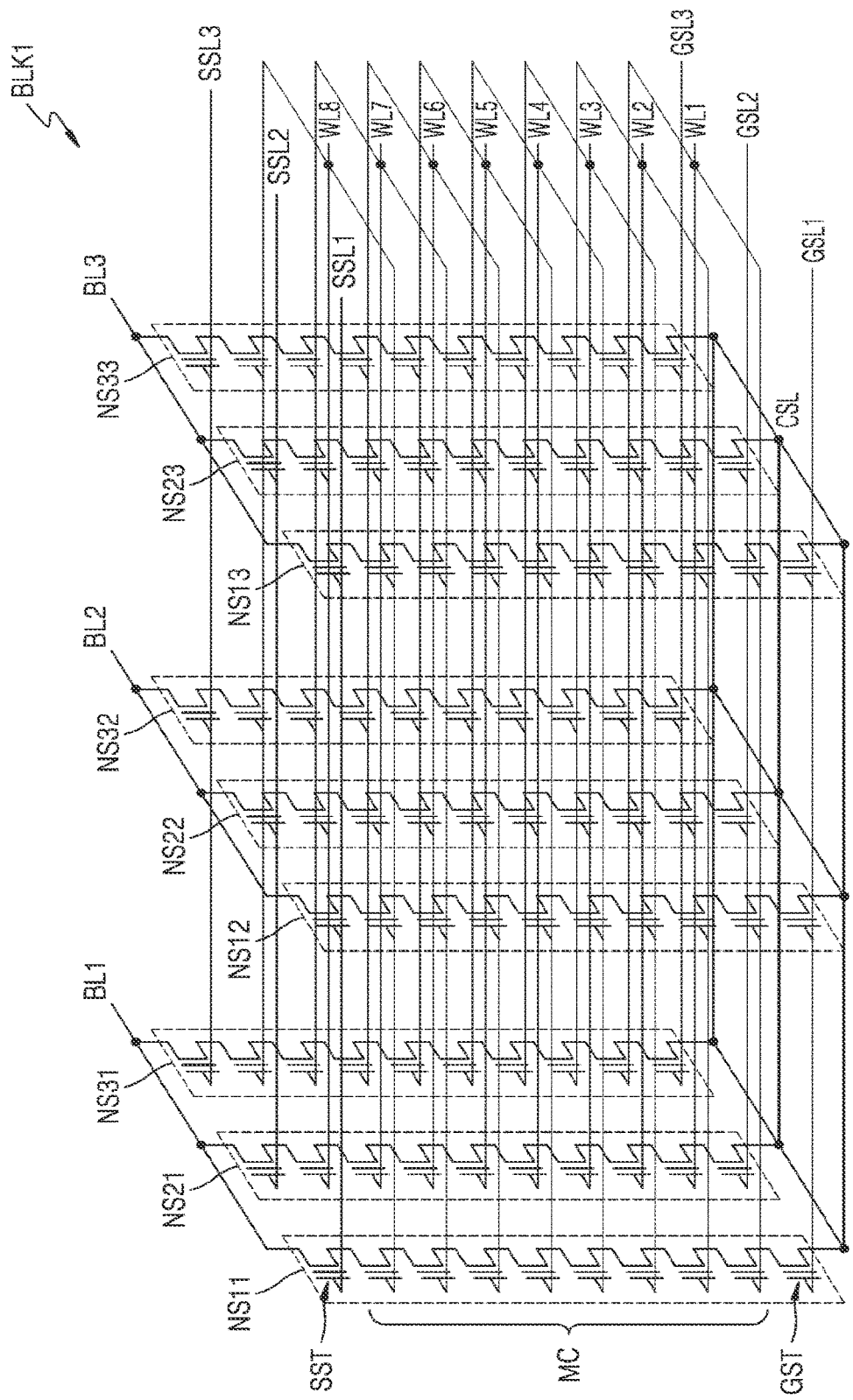
FIG. 5 is a circuit diagram of a first memory block BLK1 according to embodiments of the inventive concept.

FIG. 5 is a circuit diagram of a first memory block BLK1 according to embodiments of the inventive concept. Each memory block of the plurality of memory blocks BLK1 to BLKZ may have an equivalent structure, although the inventive concept is not limited thereto. Referring to FIG. 5, the first memory block BLK1 may include a plurality of NAND strings NS11 to NS33, a plurality of word lines WL1 to WL8, a plurality of bit lines BL1 to BL3, a plurality of ground select lines GSL1 to GSL3, a plurality of memory cell string select lines SSL1 to SSL3, and a common source line CSL. For example, the NAND string NS11 may be connected to the word lines WL1 to WL8, the bit line BL1, the ground select line GSL1, the memory cell string select line SSL1, and the common source line CSL. Each NAND string may include a string select transistor SST, a plurality of memory cells MC, and a ground select transistor GST, which may be connected in series.

Figure 6:
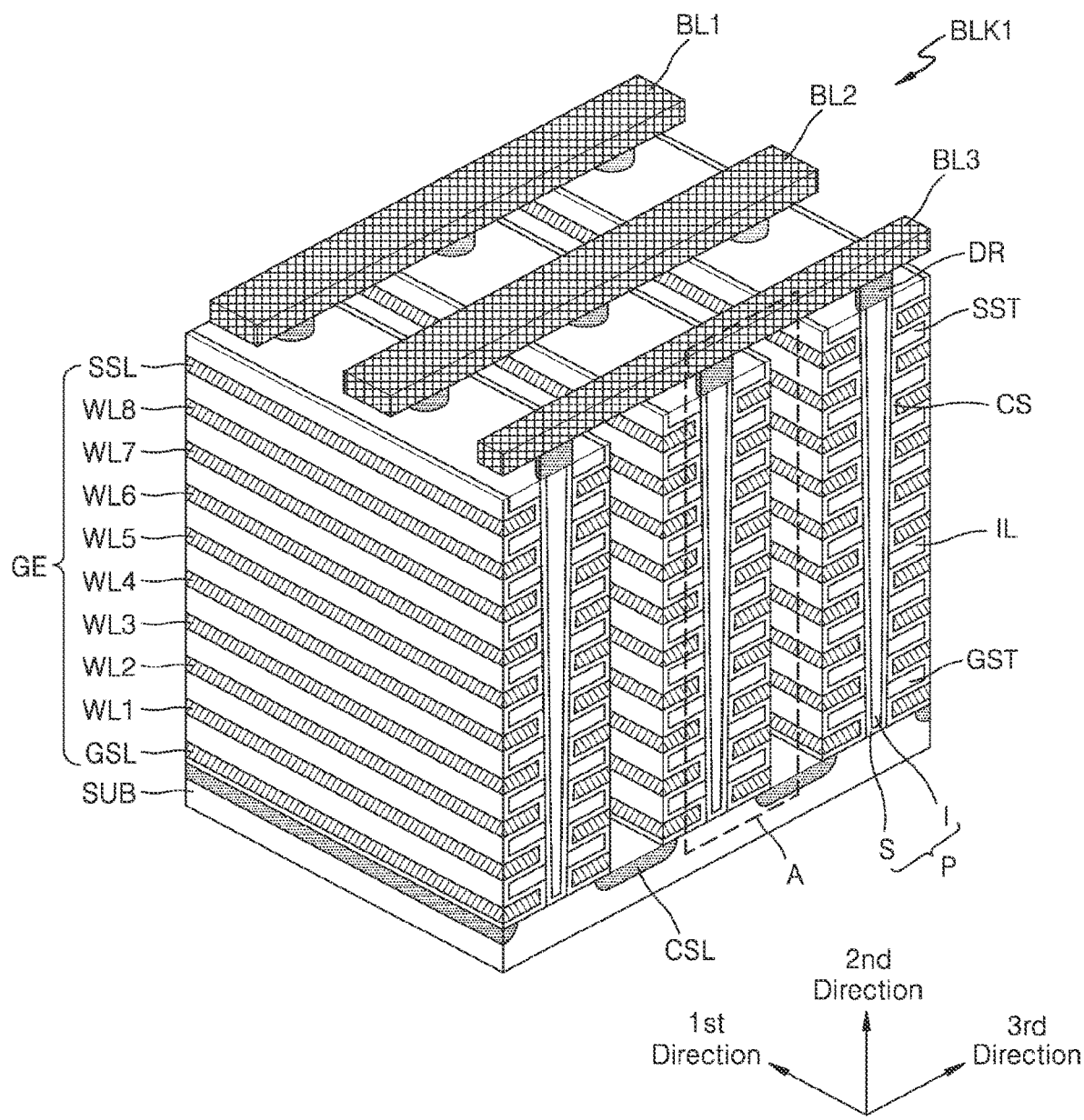
FIG. 6 is a perspective diagram of the first memory block BLK1 according to embodiments of the inventive concept.

FIG. 6 is a perspective diagram of the first memory block BLK1 according to embodiments of the inventive concept. Each memory block of the plurality of memory blocks BLK1 to BLKZ may have an equivalent structure, although the inventive concept is not limited thereto. Referring to FIG. 6, a substrate SUB may extend in a first and third direction, and the first memory block BLK1 may be disposed in a second direction perpendicular to the substrate SUB. Although FIG. 6 shows that the memory block BLK1 includes four selection lines GSL and SSL1 to SSL3, eight word lines WL1 to WL8, and three bit lines BL1 to BL3, the inventive concept is not limited thereto, and actual amounts of the included lines may be less than or greater than the illustrated amounts. For example, the first memory block BLK1 may include one or more dummy word lines disposed between a first word line WL1 and the ground select lines GSL1 to GSL3 and/or disposed between an eighth word line WL8 and the string select lines SSL1 to SSL3.

The substrate SUB may include a polysilicon film that may be doped to a first conductivity type (e.g., p type). The substrate SUB may include a bulk silicon substrate, a silicon-on-insulator (SOI) substrate, a germanium substrate, a germanium-on-insulator (GOI) substrate, a silicon-germanium substrate, or an epitaxial thin-film substrate obtained by performing a selective epitaxial growth (SEG). The substrate SUB may include a semiconductor material, e.g., silicon (Si), germanium (Ge), silicon germanium (SiGe), gallium arsenide (GaAs), indium gallium arsenide (In-GaAs), aluminum gallium arsenide (AlGaAs), or a mixture thereof.

Common source lines CSL, which may extend in a first direction on the substrate SUB and may be doped with impurities of a second conductivity type (e.g., n-type), may be provided on the substrate SUB. A plurality of insulation films IL extending in the first direction may be stacked apart from each other in the second direction on a region of the substrate SUB between two adjacent common source lines CSL The insulation films IL may include an insulating material such as silicon oxide.

A plurality of pillars P, which may be sequentially arranged in the third direction and may penetrate through the insulation films IL in the second direction, may be provided on the region of the substrate SUB between two adjacent common source lines CSL. For example, the pillars P may contact the substrate SUB by penetrating through the insulation films IL. A surface layer S of each pillar P may include a silicon-based material doped to the first conductivity type and may function as a channel region. An internal layer I of each pillar P may include an insulating material such as silicon oxide, or may be an air gap.

A charge storage layer CS may be provided along exposed surfaces of the insulation films IL, the pillars P, and the substrate SUB in the region between the two adjacent common source lines CSL. The charge storage layer CS may include a gate insulation layer (also referred to as a "tunneling insulation layer"), a charge trapping layer, and a blocking insulation layer. For example, the charge storage layer CS may have an oxide-nitride-oxide (ONO) structure. Also, gate electrodes GE, including a ground select line GSL, a string select line SSL, and word lines WL1 through WL8, may be provided on an exposed surface of the charge storage layer CS in the region between the two adjacent common source lines CSL.

Drains or drain contacts DR may be provided on the pillars P. For example, the drains or the drain contacts DR may include a silicon-based material doped with impurities of the second conductivity type. Bit lines BL1 to BL3 extending in the second direction may be provided on the drain contacts DR and may be spaced apart from one another in the first direction.

Figure 7A:
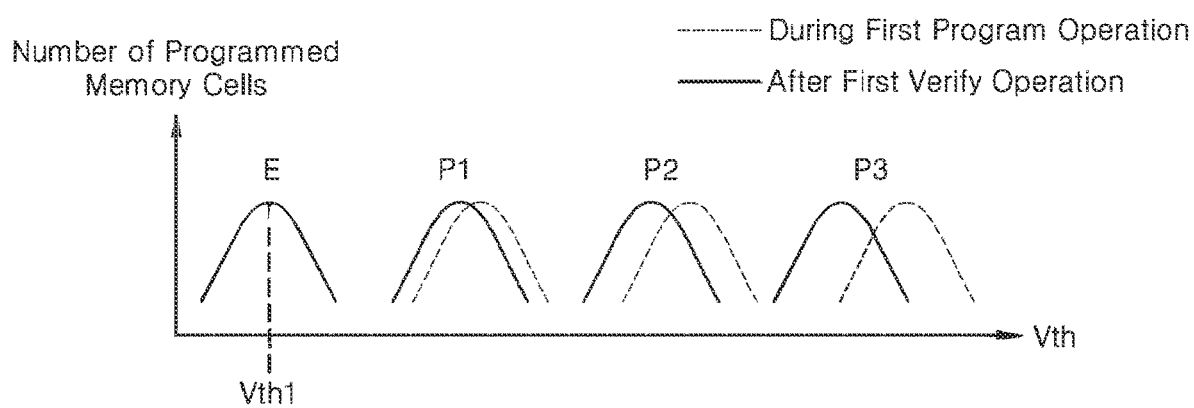
FIGS. 7A and 7B are graphs of threshold voltage distributions in the memory cell array 110 connected to a selected word line of a plurality of word lines WL during first and second program and verify operations according to embodiments of the inventive concept.
Figure 7B:
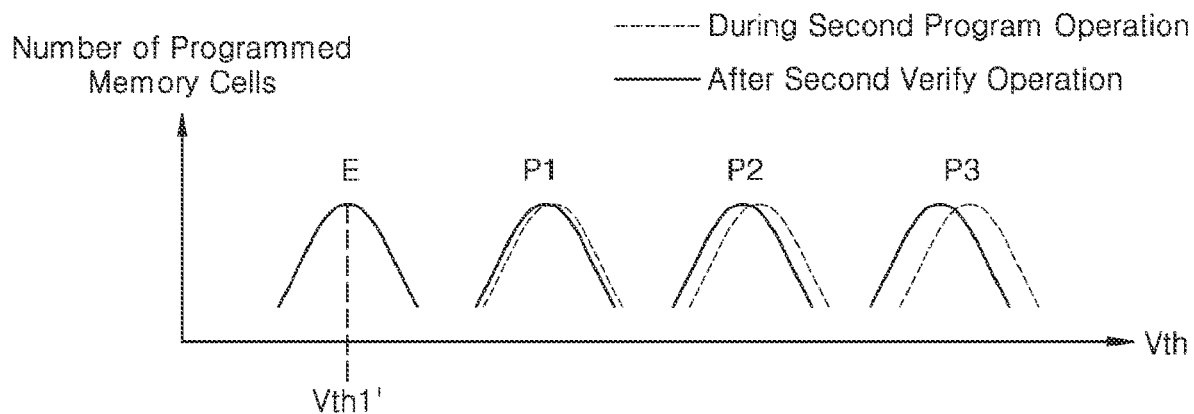

FIGS. 7A and 7B are graphs of threshold voltage distributions of memory cells in the memory cell array 110 connected to a selected word line of the plurality of word lines WL during and after first and second program operations according to embodiments of the inventive concept. The horizontal axis represents a threshold voltage Vth, and the vertical axis represents the number of programmed memory cells in the memory cell array 110 connected to a selected word line of the plurality of word lines WL. Although FIGS. 7A and 7B illustrate an embodiment in which the memory cells are multi-level memory cells (MLCs), the inventive concept is not limited thereto. For example, the memory cells may be configured to store one or more bits.

FIG. 7A illustrates a first threshold voltage distribution (indicated by dotted lines) of the memory cells during a first program operation, and a second threshold voltage distribution (indicated by solid lines) of the memory cells after the first program operation according to embodiments of the inventive concept. The memory cells may have four threshold voltage distributions. For example, the memory cells may have a threshold voltage distribution corresponding to each of an erased state E and first to third programmed states P1 to P3. As FIG. 7A illustrates, threshold voltages of the memory cells may be higher during the first program operation than they may be after the first verify operation. This may be attributed to a loss of electrons from charge trapping layers in the memory cells. The threshold voltage distributions of the respective program states may at least partially overlap with threshold voltage distributions of memory cells connected to a word line adjacent to the selected word line in the memory cell array 110. As a first program operation is performed on a second selected word line, an overlapping region between threshold voltage distributions of memory cells connected to the first word line may become wider. According to an embodiment, during a first verify operation, an adjacent voltage applied to at least one word line immediately adjacent to the at least one selected word line may have a voltage level lower than that of a read word line voltage, and a bit line voltage Vbl applied to a selected bit line of the plurality of bit lines BL may have a voltage level higher than that of a bit line sensing voltage. Therefore, target threshold voltages of the memory cells connected to the selected word line may be determined according to program states of the memory cells connected to the at least one adjacent word line.

Referring to FIG. 7A, since the memory cells connected to the adjacent word line have a low level program state in a verify operation after a program operation, the threshold voltage distributions may exhibit higher levels for the memory cells connected to the selected word line. The shift to the left of the threshold voltage distributions indicated by the positions of the dotted and solid lines illustrates threshold voltage drift caused by charges lost from charge trapping layers in memory cells as time elapses after a program operation.

FIG. 7B illustrates threshold voltage distributions of the memory cells connected to the selected word line during and after a second program operation according to a second condition different from the first condition. Referring to FIGS. 7A and 7B together, threshold voltages may increase overall as the second program operation is performed. For example, a threshold voltage Vth1' of the erase state E after the second program operation may be greater than a threshold voltage Vth1 of the erase state E after the first program operation. For example, an interval between the performance of the first program operation and the second program operation for memory cells connected to a degraded string select line may be longer than an interval between the performance of the first program operation and the second program operation for memory cells connected to another string select line. Therefore, memory cells programmed accordingly may exhibit a further improved threshold voltage distribution, and reliability of data stored in a memory device may thus be improved.

In an embodiment, as a programmed state of the memory cells connected to the adjacent word line may correspond to a high threshold voltage after the second verify operation, the memory cells connected to the selected word line may exhibit relatively low threshold voltage distributions.

Comparing the graphs of FIG. 7B and FIG. 7A, according to an embodiment of the inventive concept, a threshold voltage drift of the memory cells connected to the selected word line is minimized after performing a second program operation under different conditions than the first program operation. In short, when performing a plurality of program operations, by applying a condition optimized for each program operation, the threshold voltage distributions of memory cells may be further improved. In an embodiment of the inventive concept, each condition for each program operation may be determined by optimizing a voltage level and a voltage application time at least partially according to the number of times the corresponding program operation is performed.

As noted above, although embodiments of the inventive concept have thus far been described as including a first program operation, a first verify operation, a second program operation, and a second verify operation, the inventive concept is not limited thereto. For example, a program operation may include a third program operation, a third verify operation, and additional program and verify operations. Each successive program operation and verify operation may be based on a different condition than a previous program operation and verify operation. For example, each condition applied to each program operation may be applied by optimizing a voltage level and a voltage application time according to the number of times the corresponding program operation may be performed. For example, the number of program operations and verify operations performed may correspond to a number of bits that may be stored in the at least one selected memory cell.

Figure 8A:
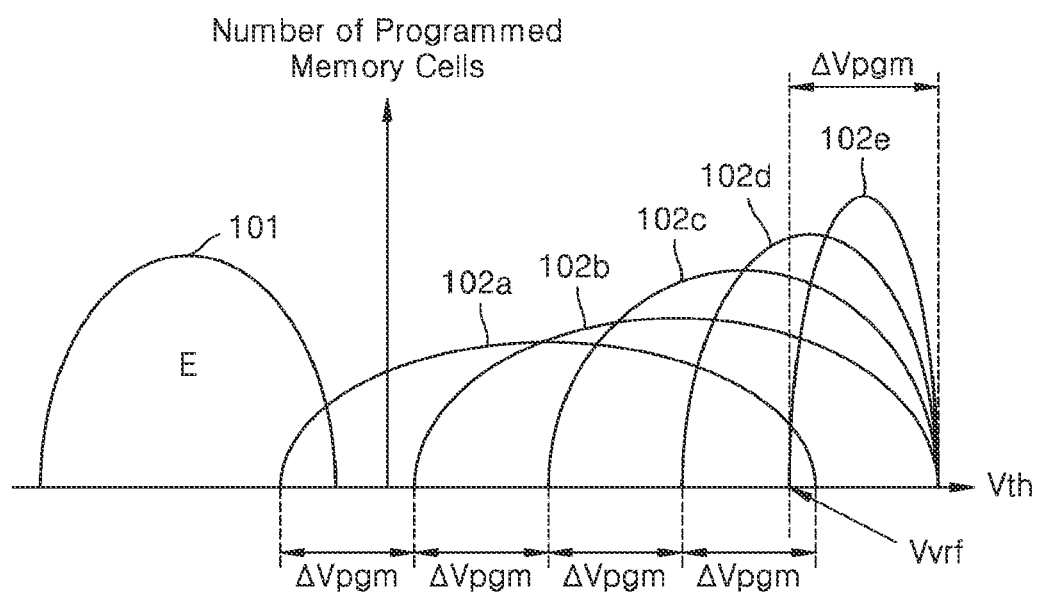
FIG. 8A is a diagram of threshold voltage distributions of memory cells associated with first and second program operations.
Figure 8B:
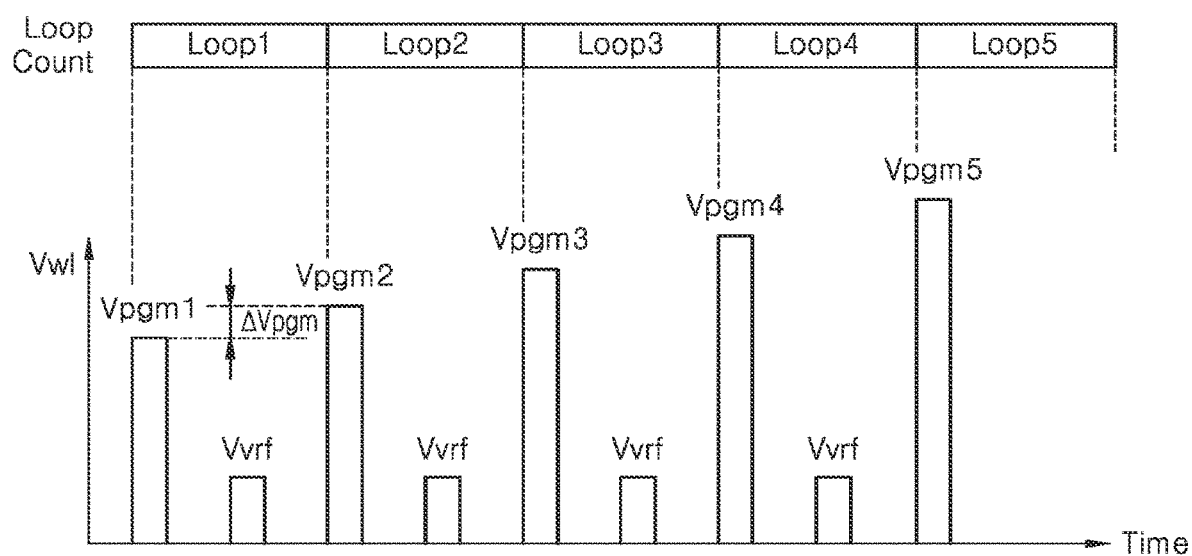
FIG. 8B is a diagram of a program operation resulting in the threshold voltage distributions of FIG. 8A.

FIG. 8A is a diagram of threshold voltage distributions of memory cell associated with first and second program operations, and FIG. 8B is a diagram illustrating a program operation resulting in the threshold voltage distributions of FIG. 8A.

Referring to FIG. 8A, the horizontal axis represents a threshold voltage Vth of the memory cells, and the vertical axis represents a number of programmed memory cells. According to an embodiment, a program operation or a verify operation may include at least one loop in which a looping program operation or a looping verify operation may be repeatedly performed. For example, memory cells in an erase state E 101 may be programmed to a first preliminary programmed state 102a by a first operation loop Loop1, the memory cells in the first preliminary programmed state 102a may be programmed to a second preliminary programmed state 102b by a second operation loop Loop2, the memory cells in the second preliminary programmed state 102b may be programmed to a third preliminary programmed state 102c by a third operation loop Loop3, the memory cells in the third preliminary programmed state 102c may be programmed to a fourth preliminary programmed state 102d by a fourth operation loop Loop4, and the memory cells in the fourth preliminary programmed state 102d may be programmed to a target programmed state 102e by a fifth operation loop Loop5.

A difference between a threshold voltage distribution of the first preliminary programmed state 102a and a threshold voltage distribution of the second preliminary programmed state 102b may correspond to a program increment value ΔVpgm. Similarly, a difference between the threshold voltage distribution of the second preliminary programmed state 102b and a threshold voltage distribution of the third preliminary programmed state 102c may correspond to the program increment value ΔVpgm, and a difference between the threshold voltage distribution of the third preliminary programmed state 102c and a threshold voltage distribution of the fourth preliminary programmed state 102d may correspond to the program increment value ΔVpgm. Also, a width of the threshold voltage distribution of the target programmed state 102e may correspond to the program increment value ΔVpgm. In other words, both a difference in threshold voltage distributions due to every operation loop and the width of the threshold voltage distribution of the target programmed state 102e may be equal to the program increment value ΔVpgm.

By checking a lower limit value of the threshold voltage distribution of the target programmed state 102e, it may be possible to verify whether memory cells are in the target programmed state, and consequently whether data has been properly programmed to the memory cells. Therefore, the lower limit value of the threshold voltage distribution of the target programmed state 102e may be used as a verify voltage Vvrf.

Referring to FIG. 8B, the horizontal axis represents time, and the vertical axis represents word line voltages Vwl. A memory device may program memory cells to have one of an erase state and at least one programmed state by performing a plurality of operation loops. In an embodiment, the operation loops may include first to fifth operation loops Loop1 to Loop5, and first to fourth operation loops Loop1 to Loop4 may each include a loop program operation for applying a program pulse Vpgm1, Vpgm2, Vpgm3, or Vpgm4, and a loop verify operation for applying a verify voltage Vvrf. In the first operation loop Loop1, a first program pulse Vpgm1 may be provided to a selected word line, and then, the verify voltage Vvrf may be provided to the selected word line. In the second operation loop Loop2, a second program pulse Vpgm2, which is higher than the first program pulse Vpgm1 by a program voltage increase amount ΔVpgm, may be provided to the selected word line to program memory cells in a programmable state, and the verify voltage Vvrf may be provided to the selected word line. The program operation and verify operation may continue accordingly until all loops are complete. The voltage level of a verify voltage Vvrf during a first verify operation may be lower than the voltage level of a verify voltage Vvrf during a second verify operation, but the inventive concept is not limited thereto.

FIG. 9 is a timing diagram of signals provided to word lines of a memory device 100 according to an embodiment of the inventive concept. FIG. 9 illustrates voltage levels provided to word lines of the memory cell array 110 during a first looping program and verify operation (OPERATION 1) or a second looping program and verify operation (OPERATION 2) according to an embodiment of the inventive concept.

Referring to FIG. 9, during OPERATION 1 or OPERATION 2, memory cells connected to a selected word line Sel WL of the plurality of word lines WL may be selected for programming Word lines of the plurality of word lines WL immediately adjacent to the selected word line Sel WL may be referred to as adjacent word lines AdjWL. Word lines of the plurality of word lines WL not immediately adjacent to the selected word line Sel WL, may be referred to as non-selected word lines UnselWL. According to an embodiment, different voltages may be provided to the selected word line Sel WL, the adjacent word lines AdjWL, and the non-selected word lines UnselWL in each of the program operations.

According to an embodiment, a program voltage Vpgm may be provided to the selected word line Sel WL, an adjacent voltage Vps may be provided to the adjacent word lines AdjWL, and a pass voltage Vrdps may be provided to the non-selected word lines UnselWL. According to an embodiment, the adjacent voltage Vps and the pass voltage Vrdps may be lower than the program voltage Vpgm.

According to an embodiment, each program operation may include at least one operation loop. Each operation loop may repeatedly program at least one selected memory cell through a plurality of voltage signals generated under a same condition. Although FIG. 9 illustrates three operation loops, the inventive concept is not limited thereto, and the number of operation loops in a program operation may vary.

A memory device 100 according to an embodiment of the inventive concept may control a voltage level in OPERA- TION 1 as a first condition and a second, different voltage level in OPERATION 2 as a second condition.

According to an embodiment, the verify voltage Vvrf may be provided as the program voltage Vpgm is provided. Also, according to an embodiment, in the first looping program and verify operation OPERATION 1, voltage levels Vpgm11, Vpgm12, and Vpgm13 of program voltages provided to the selected word line Se1WL may increase as a count of an operation loop increases.

In a first operation loop beginning OPERATION 1, the program voltage Vpgm having a first voltage level Vpgm11 may be provided to the selected word line Se1WL at time t01. At time t02, the program voltage Vpgm may transition back to logic low. At time t03, a programmed state of the at least one selected memory cell may be verified by providing the verify voltage Vvrf to the selected word line Se1WL At time t04, the verify voltage Vvrf may transition back to logic low.

In a second operation loop in OPERATION 1, at time t05, the program voltage Vpgm having a second voltage level Vpgm12 may be provided to the selected word line Se1WL. The second voltage level Vpgm12 may be higher than the first voltage level Vpgm11, and a difference between the second voltage level Vpgm12 and the first voltage level Vpgm11 may be equivalent to a program increment value ΔVpgm. The program increment value ΔVpgm and the verify voltage Vvrf may be determined on the same basis as the program increment value ΔVpgm and the verify voltage Vvrf illustrated in FIG. 8A. At time t06, the program voltage Vpgm may transition back to logic low. At time t07, the programmed state of the at least one selected memory cell may be verified by providing the verify voltage Vvrf to the selected word line Se1WL. At time t08, the verify voltage Vvrf may transition back to logic low.

In a third operation loop in OPERATION 1, at time t09, the program voltage Vpgm having a third voltage level Vpgm13 may be provided to the selected word line Se1WL. The third voltage level Vpgm13 may be higher than the second voltage level Vpgm12, and a difference between the third voltage level Vpgm13 and the second voltage level Vpgm12 may be equivalent to the program increment value ΔVpgm. At time t10, the program voltage Vpgm may transition back to logic low. At time t11, the programmed state of the at least one selected memory cell may be verified by providing the verify voltage Vvrf to the selected word line Se1WL. At time t12, the verify voltage Vvrf may transition back to logic low.

In an embodiment, OPERATION 2 may be similar to OPERATION 1, but the level of provided voltages in OPERATION 2 may be higher.

In a fourth operation loop beginning OPERATION 2, the program voltage Vpgm having a fourth voltage level Vpgm21 may be provided to the selected word line Se1WL at time t21. At time t22, the program voltage Vpgm may transition back to logic low. At time t23, the programmed state of the at least one selected memory cell may be verified by providing the verify voltage Vvrf to the selected word line Se1WL. At time t24, the verify voltage Vvrf may transition back to logic low.

In a fifth operation loop in OPERATION 2, at time t25, the program voltage Vpgm having a fifth voltage level Vpgm22 may be provided to the selected word line Se1WL. The fifth voltage level Vpgm22 may be higher than the fourth voltage level Vpgm21, and a difference between the fifth voltage level Vpgm22 and the fourth voltage level Vpgm21 may be equivalent to the program increment value ΔVpgm. At time t26, the program voltage Vpgm may transition back to logic low. At time t27, the programmed state of the at least one selected memory cell may be verified by providing the verify voltage Vvrf to the selected word line Se1WL. At time t28, the verify voltage Vvrf may transition back to logic low.

In a sixth operation loop in OPERATION 2, at time t29, the program voltage Vpgm having a sixth voltage level Vpgm23 may be provided to the selected word line Se1WL. The sixth voltage level Vpgm23 may be higher than the fifth voltage level Vpgm22, and a difference between the sixth voltage level Vpgm23 and the fifth voltage level Vpgm22 may be equivalent to the program increment value ΔVpgm. At time t30, the program voltage Vpgm may transition back to logic low. At time t31, the programmed state of the at least one selected memory cell may be verified by providing the verify voltage Vvrf to the selected word line Se1WL. At time t32, the verify voltage Vvrf may transition back to logic low.

According to an embodiment of the inventive concept, voltage levels of adjacent voltages Vps11, Vps12, and Vps13 in OPERATION 1 may be different from voltage levels of adjacent voltages Vps21, Vps22, and Vps23 in OPERATION 2. For example, the voltage levels of adjacent voltages Vps11, Vps12, and Vps13 in OPERATION 1 may be smaller than the voltage levels of adjacent voltages Vps21, Vps22, and Vps23 in OPERATION 2, respectively. Since a threshold voltage of the at least one selected memory cell after OPERATION 2 may be higher than a threshold voltage of the at least one selected memory cell after OPERATION 1 (refer to FIG. 7A), the level of a voltage applied in OPERATION 2 may be higher than the level of a voltage applied in OPERATION 1. Adjacent voltages Vps11, Vps12, Vps13, Vps21, Vps22, and Vps23 may be applied at substantially the same times as program voltages Vpgm11, Vpgm12, Vpgm13, Vpgm21, Vpgm22, and Vpgm23, respectively.

According to an embodiment of the inventive concept, an adjacent voltage increment ΔVps1, which is an increase in the voltage levels of the adjacent voltages Vps11, Vps12, and Vps13 in OPERATION 1, may be constant. For example, a difference between a voltage level of a first adjacent voltage Vps11 and a voltage level of a second adjacent voltage Vps12 may be as much as an adjacent voltage increment ΔVps1, and, in the same regard, a difference between the voltage level of the second adjacent voltage Vps12 and a voltage level of a third adjacent voltage Vps13 may be as much as an adjacent voltage increment ΔVps1.

Similarly, an adjacent voltage increment ΔVps2, which is an increase in the voltage level of the adjacent voltages Vps21, Vps22, and Vps23 in OPERATION 2, may be constant. For example, a difference between a voltage level of a fourth adjacent voltage Vps21 and a voltage level of a fifth adjacent voltage Vps22 may be as much as an adjacent voltage increment ΔVps2, and a difference between the voltage level of the fifth adjacent voltage Vps22 and a voltage level of a sixth adjacent voltage Vps23 may be as much as an adjacent voltage increment ΔVps2.

According to an embodiment of the inventive concept, when a program voltage Vpgm having a relatively high voltage level is provided to the selected word line Se1WL, an adjacent voltage having a relatively low voltage level is provided to the adjacent word lines AdjWL. As a result, the influence of the adjacent word lines AdjWL on the selected word line Se1WL may be minimized, and disturbance to a program operation may be minimized.

According to an embodiment of the inventive concept, an adjacent voltage Vps provided in a particular operation loop order in OPERATION 2 may have a higher voltage level than an adjacent voltage Vps provided in the same operation loop order in OPERATION 1. For example, the voltage level of the first adjacent voltage Vps11 may be lower than the voltage level of the fourth adjacent voltage Vps21, the voltage level of the second adjacent voltage Vps12 may be lower than the voltage level of the fifth adjacent voltage Vps22, and the voltage level of the third adjacent voltage Vps13 may be lower than the voltage level of the sixth adjacent voltage Vps23. According to an embodiment of the inventive concept, since the voltage levels of adjacent voltages in OPERATION 2 are higher than the voltage levels of adjacent voltages in OPERATION 1, threshold voltage distributions of the at least one selected memory cell may be improved.

According to an embodiment of the inventive concept, the adjacent voltage increment ΔVps2, which is a difference between the voltage level of adjacent voltage Vps that increases as a count of an operation loop increases in OPERATION 2, may be smaller than the adjacent voltage increment ΔVps1, which increases as a count of an operation loop increases in OPERATION 1 (ΔVps1>ΔVps2). In an embodiment, the voltage level of the fourth adjacent voltage Vps21 may be higher than the voltage level of the first adjacent voltage Vps11, but the increasing rate of the voltage level of adjacent voltages may be small. For example, the voltage level of the fourth adjacent voltage Vps21 may be 8 volts (V) when the voltage level of the first adjacent voltage Vps11 is 7 V, and the voltage level of the fifth adjacent voltage Vps22 may be 8.2 V when the voltage level of the second adjacent voltage Vps12 is 7.5 V. In other words, the adjacent voltage increment ΔVps1, which is a difference between the voltage level of the first adjacent voltage Vps11 and the voltage level of the second adjacent voltage Vps12, is 0.5 V, but the adjacent voltage increment ΔVps2, which is a difference between the voltage level of the fourth adjacent voltage Vps21 and the voltage level of the fifth adjacent voltage Vps22, may be 0.2 V. In other words, the adjacent voltage increment ΔVps1 in OPERATION 1 may be greater than the adjacent voltage increment ΔVps2 in OPERATION 2. The inventive concept is not limited to the above-stated values, which are merely used for convenience.

According to an embodiment of the inventive concept, voltage levels of pass voltages Vrdps11, Vrdps12, and Vrdps13 in OPERATION 1 may be different from voltage levels of pass voltages Vrdps21, Vrdps22, and Vrdps23 in OPERATION 2. For example, the voltage levels of pass voltages Vrdps11, Vrdps12, and Vrdps13 in OPERATION 1 may be smaller than the voltage levels of pass voltages Vrdps21, Vrdps22, and Vrdps23 in OPERATION 2, respectively. Since a threshold voltage of the at least one selected memory cell after OPERATION 2 is higher than a threshold voltage of the at least one selected memory cell after OPERATION 1 (refer to FIG. 7A), the level of a voltage provided in OPERATION 2 may be higher than the level of a voltage provided in OPERATION 1. Pass voltages Vrdps11, Vrdps12, Vrdps13, Vrdps21, Vrdps22, and Vrdps23 may be applied at substantially the same time points as program voltages Vpgm11, Vpgm12, Vpgm13, Vpgm21, Vpgm22, and Vpgm23, respectively.

According to an embodiment of the inventive concept, a pass voltage increment ΔVrdps1, which is an increase in the voltage levels of the pass voltages Vrdps11, Vrdps12, and Vrdps13 in OPERATION 1, may be constant. For example, a difference between the voltage level of a first pass voltage Vrdps11 and the voltage level of a second pass voltage Vrdps12 may be as much as a pass voltage increment ΔVrdps1, and, in the same regard, a difference between the voltage level of the second pass voltage Vrdps12 and the voltage level of a third pass voltage Vrdps13 may be as much as a pass voltage increment ΔVrdps1. Similarly, a pass voltage increment ΔVrdps2, which is an increase in the voltage level of the pass voltages Vrdps21, Vrdps22, and Vrdps23 in OPERATION 2, may be constant. For example, a difference between the voltage level of a fourth pass voltage Vrdps21 and the voltage level of a fifth pass voltage Vrdps22 may be as much as a pass voltage increment ΔVrdps2, and, in the same regard, a difference between the voltage level of the fifth pass voltage Vrdps22 and the voltage level of a sixth pass voltage Vrdps23 may be as much as a pass voltage increment ΔVrdps2.

According to an embodiment, when a program voltage Vpgm having a relatively high voltage level is provided to the selected word line Se1WL, a pass voltage having a relatively low voltage level is provided to the non-selected word line UnselWL. As a result, influence of the non-selected word line UnselWL on the selected word line Se1WL may be minimized, and program disturbance to a program operation may be prevented.

According to an embodiment of the inventive concept, a pass voltage Vrdps provided to a particular operation loop order in OPERATION 2 may have a higher voltage level than a pass voltage Vrdps provided to the same operation loop order in OPERATION 1. For example, the voltage level of the first pass voltage Vrdps11 may be lower than the voltage level of the fourth pass voltage Vrdps21, the voltage level of the second pass voltage Vrdps12 may be lower than the voltage level of the fifth pass voltage Vrdps22, and the voltage level of the third pass voltage Vrdps13 may be lower than the voltage level of the sixth pass voltage Vrdps23. According to an embodiment of the inventive concept, since the voltage levels of pass voltages in OPERATION 2 are higher than the voltage levels of pass voltages in OPERATION 1, the threshold voltage distribution of the at least one selected memory cell may be improved.

According to an embodiment of the inventive concept, the pass voltage increment ΔVrdps2, which is a difference between the voltage level of pass voltage Vrdps that may increase as a count of an operation loop increases OPERATION 2, may be smaller than the pass voltage increment ΔVrdps1, which may increase as a count of an operation loop increases in OPERATION 1 (ΔVrdps1>ΔVrdps2). In an embodiment, the voltage level of the fourth pass voltage Vrdps21 may be higher than the voltage level of the first pass voltage Vrdps11, but the increasing rate of the voltage level of pass voltages may be small. For example, the voltage level of the fourth pass voltage Vrdps21 may be 8 V when the voltage level of the first pass voltage Vrdps11 is 7 V, and the voltage level of the fifth pass voltage Vrdps22 may be 8.2 V when the voltage level of the second pass voltage Vrdps12 is 7.5 V. In other words, the pass voltage increment ΔVrdps1, which is a difference between the voltage level of the first pass voltage Vrdps11 and the voltage level of the second pass voltage Vrdps12, may be 0.5V, but the pass voltage increment ΔVrdps2, which is a difference between the voltage level of the fourth pass voltage Vrdps21 and the voltage level of the fifth pass voltage Vrdps22, may be 0.2V. In other words, the pass voltage increment ΔVrdps1 in OPERATION 1 may be greater than the pass voltage increment ΔVrdps2 in OPERATION 2. The inventive concept is not limited to the above-stated values, which are merely used for convenience.

Figure 10:
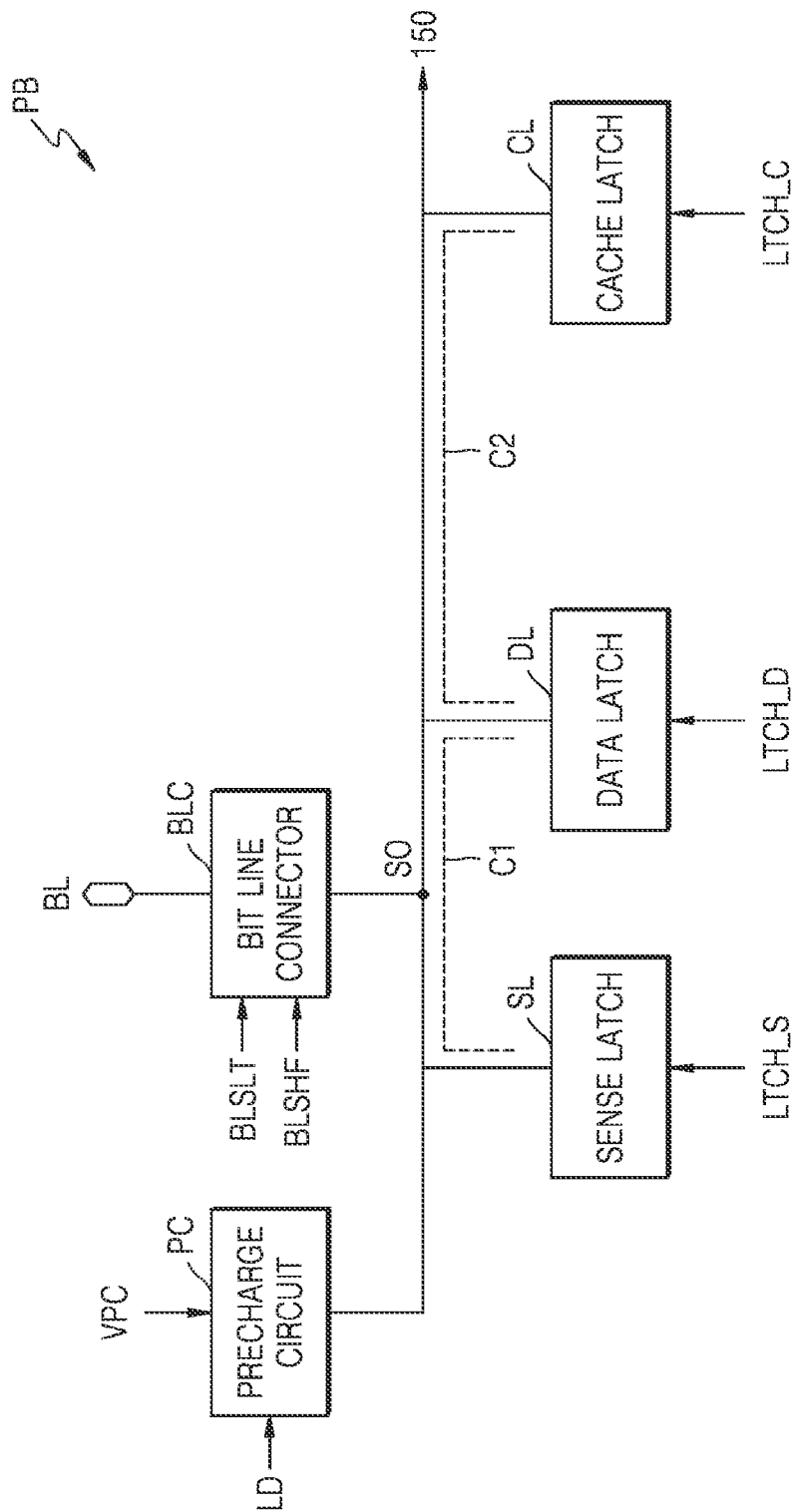
FIG. 10 is a block diagram of a page buffer in a page buffer circuit 140 of FIG. 2, according to an embodiment of the inventive concept.

FIG. 10 is a block diagram of a page buffer circuit 140 of FIG. 2, according to an embodiment of the inventive concept.

The page buffer circuit 140 may include at least one page buffer PB. Each page buffer PB may perform a sequential read operation for each memory cell page included in a memory cell array 110. For example, a first page buffer and a second page buffer may sense and output data stored in a first memory cell page and sense and output data stored in a second memory cell page.

Referring to FIG. 10, the page buffer PB includes a sense latch SL, a data latch DL, and a cache latch CL, and may further include a bit line connector BLC and a pre-charge circuit PC. The components included in the page buffer PB may be connected through a wire branched from a sense-out node SO.

According to an embodiment, the sense latch SL may be electrically connected to a bit line of the plurality of bit lines BL. The sense latch SL may sense and store data stored in a memory cell in the memory cell array 110 via a sense-out voltage of the sense-out node SO based on a sensing latch control signal LTCH_S. Also, the sense latch SL may dump data to the cache latch CL based on the sensing latch control signal LTCH_S. The cache latch CL may transmit dumped data to an input/output circuit 150 based on a cache latch control signal LTCH_C. The input/output circuit 150 may output data received from the cache latch CL.

According to an embodiment, the sense latch SL may sense a change in potential of the sense-out node SO and may store data corresponding to the change in potential. In other words, the sense latch SL may sense and store data of at least one selected memory cell through the bit line BL. The control logic 160 may transmit the sense latch control signal LTCH_S to dump data stored in the sense latch SL to a data latch DL. In this case, the sense latch SL may dump data to the data latch DL via a first current path C1. Meanwhile, the control logic 160 may transmit a data latch control signal LTCH_D to dump data stored in the data latch DL to the cache latch CL. In this case, the data latch DL may dump data to the cache latch CL via a second current path C2.

In an embodiment, the sense latch SL may sense data stored in memory cells of the first memory cell page and dump the data to the cache latch CL. Meanwhile, while the cache latch CL is outputting dumped data of the first memory cell page, the sense latch SL may sense data of the second memory cell page. This is possible because an operation for sensing a bit line and an operation for outputting data are performed by different latches.

According to an embodiment, the sense latch SL may sense data of the first memory cell page from a sense out voltage. Thereafter, the sense latch SL may dump the data of the first memory cell page to the data latch DL. The data latch DL may dump dumped data to the cache latch CL. While the data latch DL is dumping data, the sense latch SL may sense data of the second memory cell page. In other words, a sensing operation and a dumping operation performed by different latches SL and DL may be performed in parallel. Meanwhile, the cache latch CL may output data dumped from the data latch DL.

During a verify operation according to an embodiment of the inventive concept, the control logic 160 may control a pre-charging of the bit line BL. For example, the control logic 160 may pre-charge the bit line BL to a particular voltage level VPC by providing a load signal LD to the pre-charge circuit PC and a control signal BLSHF to the bit line connector BLC. In this case, the bit line connector BLC may maintain a turned-on state by receiving a bit line selection signal BLSLT from the control logic 160. Thereafter, the control logic 160 may deactivate the load signal LD, and charges provided to the sense-out node SO may flow to the bit line BL through the bit line connector BLC.

When at least one selected memory cell is in an on state, charges provided to the sense-out node SO may be discharged to the common source line CSL through the bit line BL and a string channel. In this case, since a current flowing from the sense-out node SO to the bit line BL is relatively large, the voltage of the sense-out node SO may drop relatively quickly. On the other hand, when the at least one selected memory cell is in an off state, it is difficult for charges provided to the sense-out node SO to be discharged to the common source line CSL through the bit line BL. Therefore, since a current flowing from the sense-out node SO to the bit line BL may be relatively small, the voltage of the sense-out node SO may drop relatively slowly.

Figure 11:
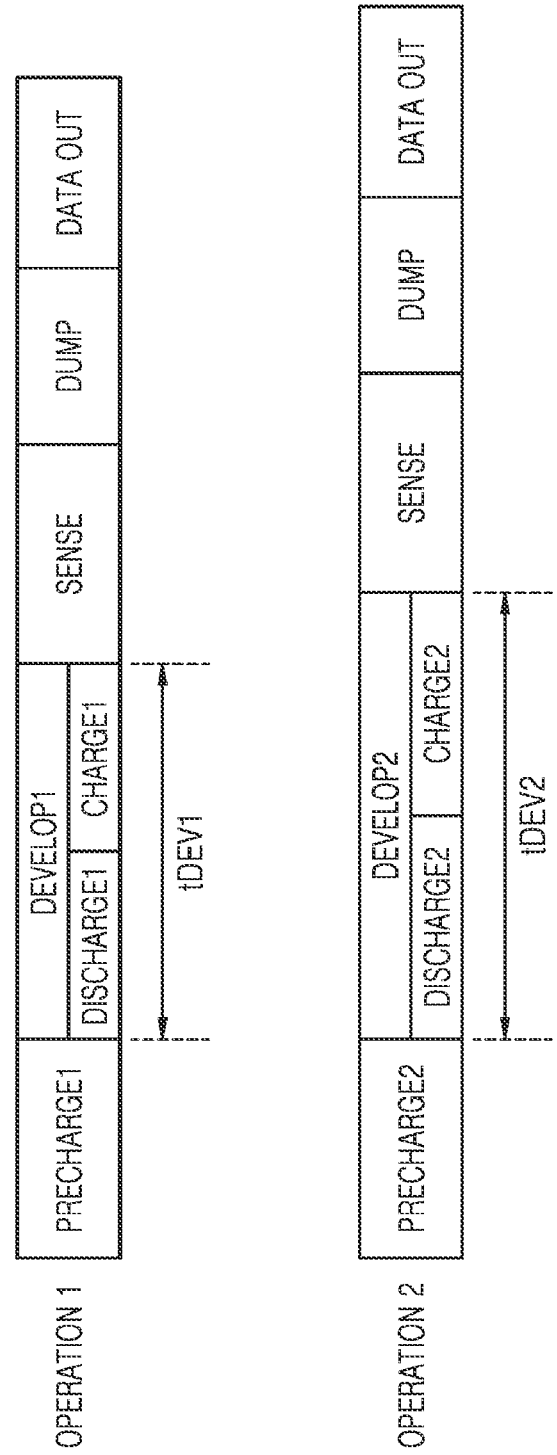
FIG. 11 is a data flowchart of a method of sensing and outputting data of memory cell pages of the memory cell array 110 according to an embodiment of the inventive concept.

FIG. 11 is a data flowchart of a method of sensing and outputting data of memory cell pages of the memory cell array 110 according to an embodiment of the inventive concept.

According to an embodiment, in a first program and verify operation OPERATION 1, the control logic 160 may control the voltage level of a bit line through a first pre-charging operation PRECHARGE 1 performed by the memory device 100. For a pre-charging operation, a pre-charge voltage may be applied to the plurality of bit lines BL. In an embodiment, the first pre-charging operation PRECHARGE 1 may be performed in accordance with the pre-charging operation described with reference to FIG. 10.

Thereafter, the program logic 161 may read memory cells through a first developing operation DEVELOP1. An elapsed time for performing the first developing operation DEVELOP1 may be referred to as a first development time tDEV1. In an embodiment, the first developing operation DEVELOP1 may include a discharging operation DISCHARGE1 and a charging operation CHARGE1.

During the developing operation DEVELOP1, the control logic 160 may determine whether the memory cells are in a programmed state by discharging the bit line voltage provided to the plurality of bit lines BL. For example, a non-programmed memory cell may have a relatively high output voltage level, but a programmed memory cell may have a relatively low output voltage level even after the pre-charge voltage is discharged from the plurality of bit lines BL.

In an embodiment, during the charging operation CHARGE1, the control logic 160 may charge a capacitor connected to a sensing node, thereby maintaining the bit line voltage and recharging only the sense-out node SO. Through the charging operation CHARGE1, an elapsed time to pre-charge a bit line in a subsequent pre-charging operation may be reduced. This technique of performing a discharging operation and a charging operation in one developing operation may be referred to as a double sensing technique.

Thereafter, a sensing operation, a dumping operation, and a data outputting operation may be sequentially performed in accordance with the description provided with reference to FIG. 10.

The memory device 100 may then perform a similar second program and verify operation OPERATION 2. However, according to an embodiment of the inventive concept, tDEV2 may be longer than tDEV1. When a voltage application time applied to discharge a voltage of a bit line is too short, most memory cells connected to a bit line may be determined to be in an off state, regardless of their actual state. However, when a voltage application time applied to discharge the voltage of the bit line is too long, most of the memory cells connected to the bit line may be determined to be in an on state, regardless of their actual state. By increasing a voltage application time to discharge the bit lines in OPERATION 2 as compared to OPERATION 1, programmed states of the memory cells in the memory cell array 110 may be determined more accurately, and thus the threshold voltage distribution of the memory cells may become more precise. However, the inventive concept is not limited to the second development time tDEV2 being longer than the first development time tDEV1, and tDEV2 may be equal to or shorter than tDEV1.

Figure 12:
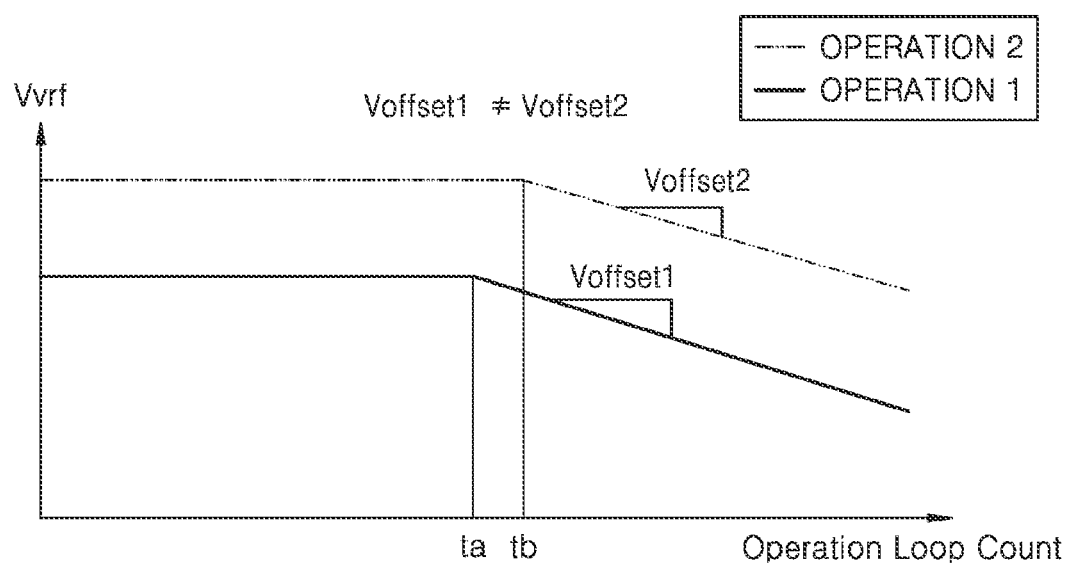
FIG. 12 is a graph of voltage levels provided to a selected word line of a plurality of word lines WL according to an embodiment of the inventive concept.

FIG. 12 is a graph of voltages provided to a selected word line of the plurality of word lines WL according to an embodiment of the inventive concept. The horizontal axis of the graph shown in FIG. 12 represents a number of operation loop counts, and the vertical axis represents voltage levels of the verify voltage Vvrf. Referring to FIG. 12, a looping program and verify operation may include not only a looping program operation for programming data to at least one selected memory cell in the memory cell array 110, but also a looping verify operation for verifying programmed states of memory cells connected to the selected word line. The looping program operation and the looping verify operation may each include operation loops in which a program operation and/or a verify operation may be repeatedly performed.

According to an embodiment, the verify voltage Vvrf used in a second looping program and verify operation may be higher than a verify voltage Vvrf used in a first looping program and verify operation. Every time a looping program and verify operation corresponding to a selected word line is performed, the number of programmed memory cells connected to the selected word line may increase, and, since programmed memory cells may include relatively large numbers of electrons, the voltage level of the verify voltage Vvrf needs to be increased as the count of the program operation increases.

In an embodiment of the inventive concept, as the count of an operation loop performing a program operation increases, the verify voltage Vvrf may gradually decrease. In this case, a degree to which the voltage level of the verify voltage Vvrf decreases as the count of the operation loop increases may be referred to as a verify voltage shift offset Voffset. In an embodiment, a first verify voltage shift offset (Voffset1) of the first looping program and verify operation (OPERATION 1) may be different from a second verify voltage shift offset (Voffset2) of the second looping program and verify operation (OPERATION 2).

In an embodiment of the inventive concept, the verify voltage Vvrf in each program operation may be constant and then gradually decrease. For example, in OPERATION 1, as the count of the operation loop increases, the verify voltage Vvrf may maintain a constant level and may then decrease with a constant slope after time ta. Since the count of the operation loop increases as time passes, the decreasing rate per count of the operation loop may correspond to a decreasing rate per unit time. Similarly, in OPERATION 2, as the count of the operation loop increases, the verify voltage Vvrf may maintain a constant level and then decrease with a constant slope after time tb.

According to an embodiment of the inventive concept, Voffset1 may be different from Voffset2. In some embodiments, Voffset1 may be greater than Voffset2. In some embodiments, Voffset1 may be smaller than Voffset2. Although Voffset1 may be different from Voffset2, the voltage level of the verify voltage Vvrf in OPERATION 2 may be higher than the voltage level of the verify voltage Vvrf in OPERATION 1.

Figure 13:
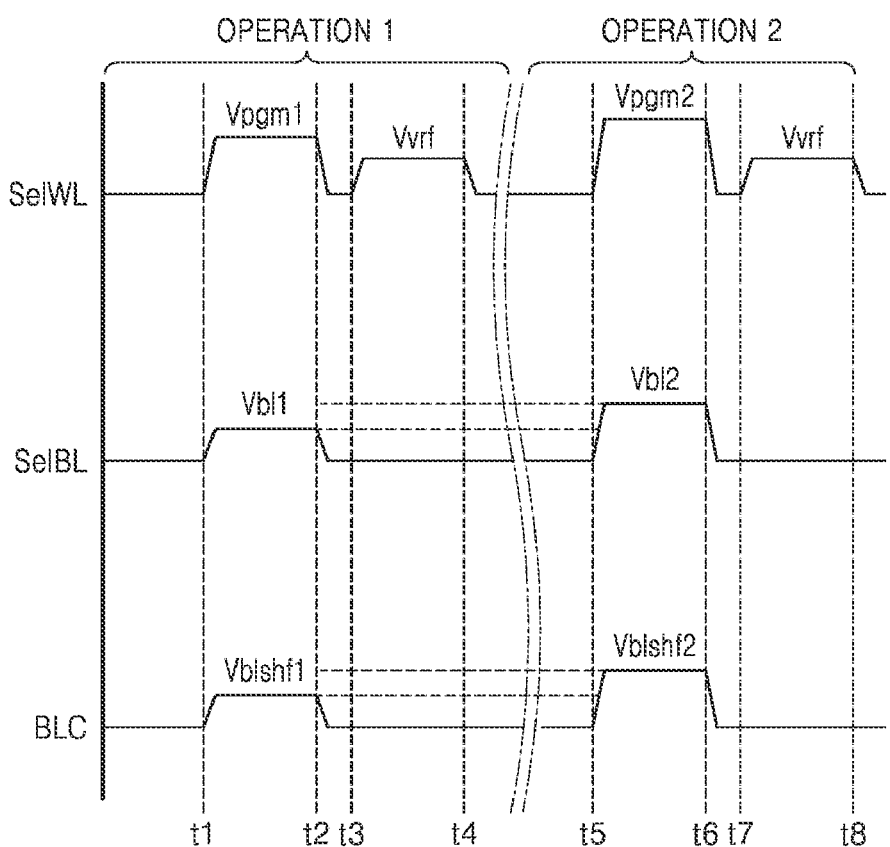
FIG. 13 is a timing diagram according to an embodiment of the inventive concept of signals applied to a selected word line of the plurality of word lines WL, a selected bit line of the plurality of bit lines BL, and a bit line connector BLC of a page buffer in the page buffer circuit 140 connected to the selected bit line.
Figure 14:
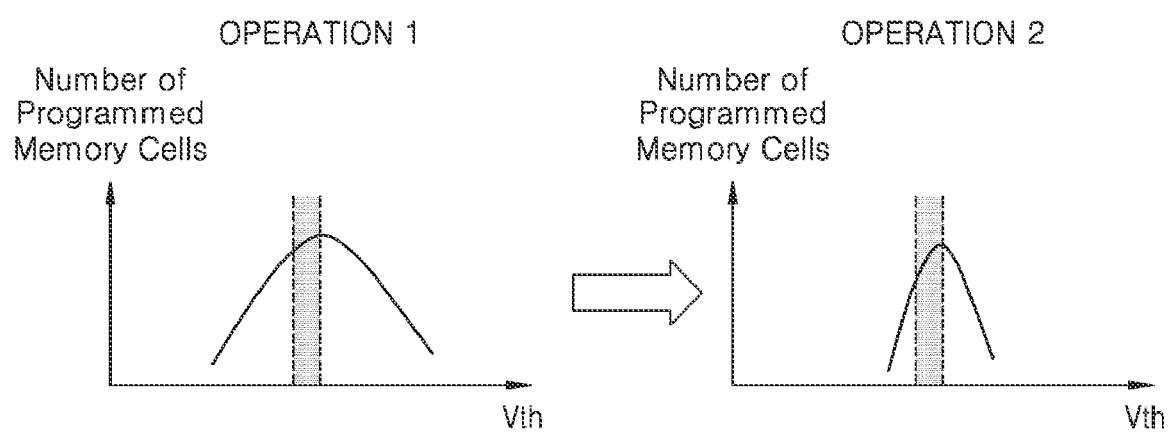
FIG. 14 is a graph of threshold voltage distributions associated with FIG. 13.

FIG. 13 is a timing diagram according to an embodiment of the inventive concept of signals applied to a selected word line of the plurality of word lines WL, a selected bit line of the plurality of bit lines BL, and a bit line connector BLC of a page buffer in the page buffer circuit 140 connected to the selected bit line. FIG. 14 is a graph of threshold voltage distributions associated with FIG. 13.

In the graph shown in FIG. 13, the horizontal axis represents time, and the vertical axis represents voltage levels. Referring to FIG. 13, a program voltage Vpgm may be provided to the selected word line Se1WL. A bit line voltage Vbl may be provided to the selected bit line SelBL. A control signal BLSHF may be provided to the bit line connector BLC connected to the selected bit line SelBL. As the control signal BLSHF is applied to the bit line connector BLC, the bit line voltage Vbl may be provided to the sense-out node SO.

According to an embodiment, a first program and verify operation (OPERATION 1) may be performed from a first time t1 to a fourth time t4. At the first time t1, the bit line voltage Vbl may transition from logic low to a first bit line level Vbl1, the program voltage Vpgm may transition from logic low to a first program level Vpgm1, and the control signal BLSHF may transition to a first control level Vblshf1.

At a second time t2, the bit line voltage Vbl, the program voltage Vpgm, and the control signal BLSHF may transition back to logic low. At a third time point t3, a verify voltage Vvrf may be provided to the selected word line Se1WL. At the fourth time t4, the verify voltage Vvrf may transition to logic low.

According to an embodiment, a second program and verify operation (OPERATION 2) may be performed from a fifth time t5 to an eighth time t8. At the fifth time t5, the bit line voltage Vbl may transition from logic low to a second bit line level Vbl2, the program voltage Vpgm may transition from logic low to a second program level Vpgm2, and the control signal BLSHF may transition to a second control level Vblshf2.

At a sixth time t6, the bit line voltage Vbl, the program voltage Vpgm, and the control signal BLSHF may transition back to logic low. At a seventh time t7, the verify voltage Vvrf may be provided to the selected word line Se1WL. At the fourth time t8, the verify voltage Vvrf may transition to logic low.

According to an embodiment of the inventive concept, the second bit line voltage level Vbl2 may be higher than the first bit line voltage level Vbl1.

Referring to FIG. 14, the horizontal axis of the illustrated graph represents threshold voltage distributions in a selected memory cell string in the memory cell array 110, and the vertical axis represents the number of programmed memory cells in the selected memory cell string. According to an embodiment, when data is programmed to at least one selected memory cell in the selected memory cell string, programming interference may be caused by memory cells in the memory cell array 110 surrounding the selected memory cell string. To reduce this interference, a program voltage gap may be reduced by increasing a voltage level of a bit line voltage Vbl provided to memory cells in the memory cell array 110 adjacent to the at least one selected memory cell, and thus a threshold voltage distribution in the selected memory cell string may be narrowed. Therefore, the reliability of threshold voltage distributions of memory cell strings may be improved by providing a higher bit line voltage during a second program operation than in a first program operation.

Figure 15:
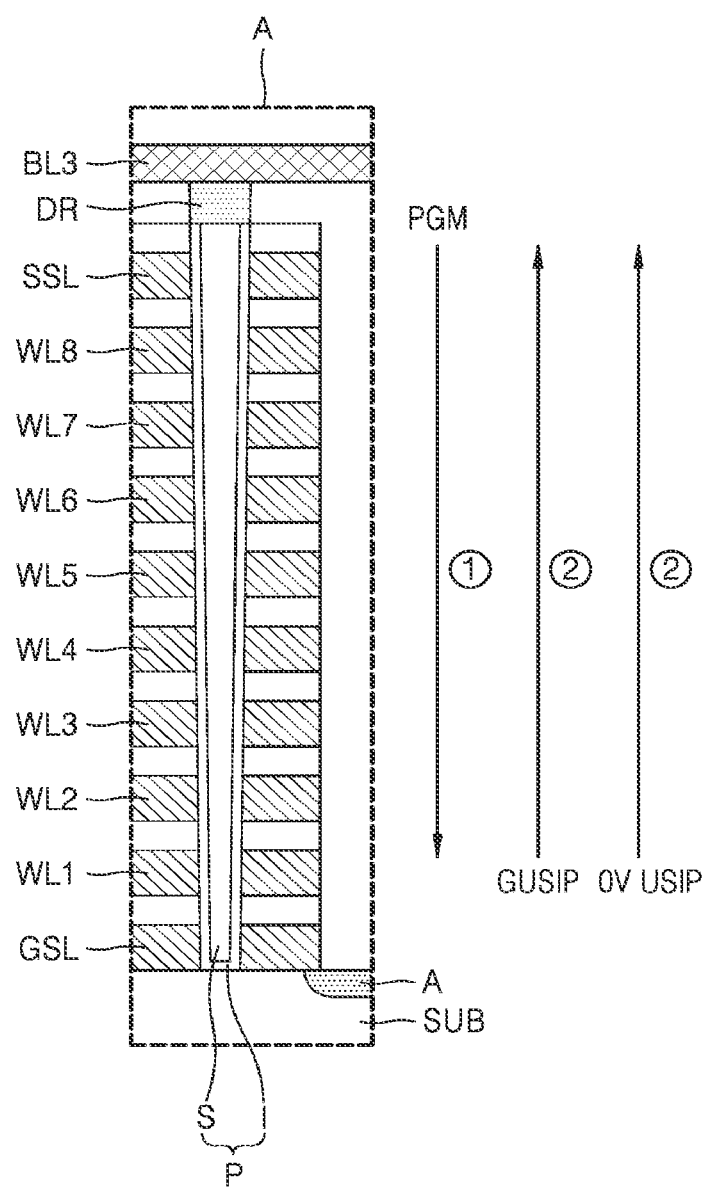
FIG. 15 is a diagram of an area A of FIG. 6 during a pre-charge operation according to an embodiment of the inventive concept.

FIG. 15 is a diagram of an area A of FIG. 6 during a pre-charge operation.

FIG. 15 illustrates a plurality of programming directions for a memory cell string connected to an arbitrary string select line SSL. In an embodiment, a pre-charge voltage may be applied through a third bit line BL3, for example. As the pre-charge voltage is applied, a turn-on voltage may be provided to a adjacent word lines WL5 and WL7 adjacent to a selected word line WL6, for example. Therefore, since adjacent word lines may form a channel by being set to an on state via the turn-on voltage, the pre-charge voltage may reach a memory cell connected to the selected word line WL6. As a result, boosting efficiency of unselected memory cell strings may be improved during a program operation that may be performed subsequently to the pre-charge operation. As the turn-on voltage is applied to adjacent word lines, a phenomenon such as hot carrier injection may be prevented during a subsequent program operation for a given memory cell.

In this way, an operation for applying an initial pre-charge voltage to an unprogrammed memory cell string may be referred to as an unselect string initial pre-charge (USIP) operation. In a USIP operation, hot carrier injection may occur due to a pattern value of memory cells when signals are sequentially provided to a given word line, and as a result, threshold voltage distributions of the memory cells may deteriorate.

According to an embodiment of the inventive concept, a USIP operation performed prior to a first program and verify operation may be different from a USIP operation performed prior to a second program and verify operation. In detail, prior to the first program and verify operation, memory cells in a memory cell string may be pre-charged by being provided with a pre-charge voltage. Prior to the second program and verify operation, a pre-charge voltage may be provided to the memory cell string such that the level of the pre-charge voltage applied to the memory cell string is relatively low or substantially close to zero (0).

According to an embodiment, memory cells in a memory cell string connected to the third bit line BL3 (for example) may be programmed in an order of a direction from a string select line SSL to a ground select line (direction 1). For example, after a program voltage is provided to the eighth word line WL8, the program voltage may be provided to the seventh word line WL7.

When data is programmed in direction 1, it may be necessary to perform pre-charging operations in an order of a direction from a region to which data has not yet been programmed to avoid pattern values of programmed memory cells influencing the operations. Therefore, the pre-charge voltage may be provided in an order of a direction from the ground select line GSL to the string select line SSL (direction 2). For example, after the pre-charge voltage is provided to the first word line WL1, the pre-charge voltage may be provided to the second word line WL2. An operation of pre-charging in an order of a direction from the ground select line GSL to the string select line SSL is referred to as a GUSIP (first pre-charge) operation.

According to an embodiment of the inventive concept, when the first pre-charge GUSIP operation is performed in direction 2, as the voltage level of a memory cell string increases, the boosting efficiency of un-selected memory cell strings may be increased during a subsequent program operation. Also, since non-selected word lines are relatively insensitive to a disturbance that may be caused by the presence of adjacent electrons, the threshold voltage distribution of the selected memory cell string may be improved. However, a high potential difference that may occur at both ends of the selected word line Se1WL may disturb a program operation due to the possibility of hot carrier injection.

According to an embodiment of the inventive concept, the memory cells in the selected memory cell string may be pre-charged once more in in an order of direction 2. At this time, the second pre-charge voltage may be lower than the first pre-charge voltage, down to a level of about 0 V. A method of applying a second pre-charge voltage that is lower than the first pre-charge voltage in direction 2 is referred to as a 0 V USIP operation. However, the inventive concept is not limited thereto, and the second pre-charge voltage may be equal to or greater than the first pre-charge voltage.

According to an embodiment of the inventive concept, the threshold voltage distribution of the selected memory cell string may be further optimized in the 0V USIP operation by reducing disturbance to a program operation due to hot carrier injection resulting from the GUSIP operation.

According to an embodiment of the inventive concept, threshold voltage distributions of memory cells connected to non-selected word lines may be improved in the first pre-charge (GUSIP) operation, and, as the threshold voltage distribution of memory cells connected to the selected word line Se1WL is improved in the second pre-charge (0V USIP) operation, the threshold voltage distribution of memory cells may be improved overall.

Figure 16:
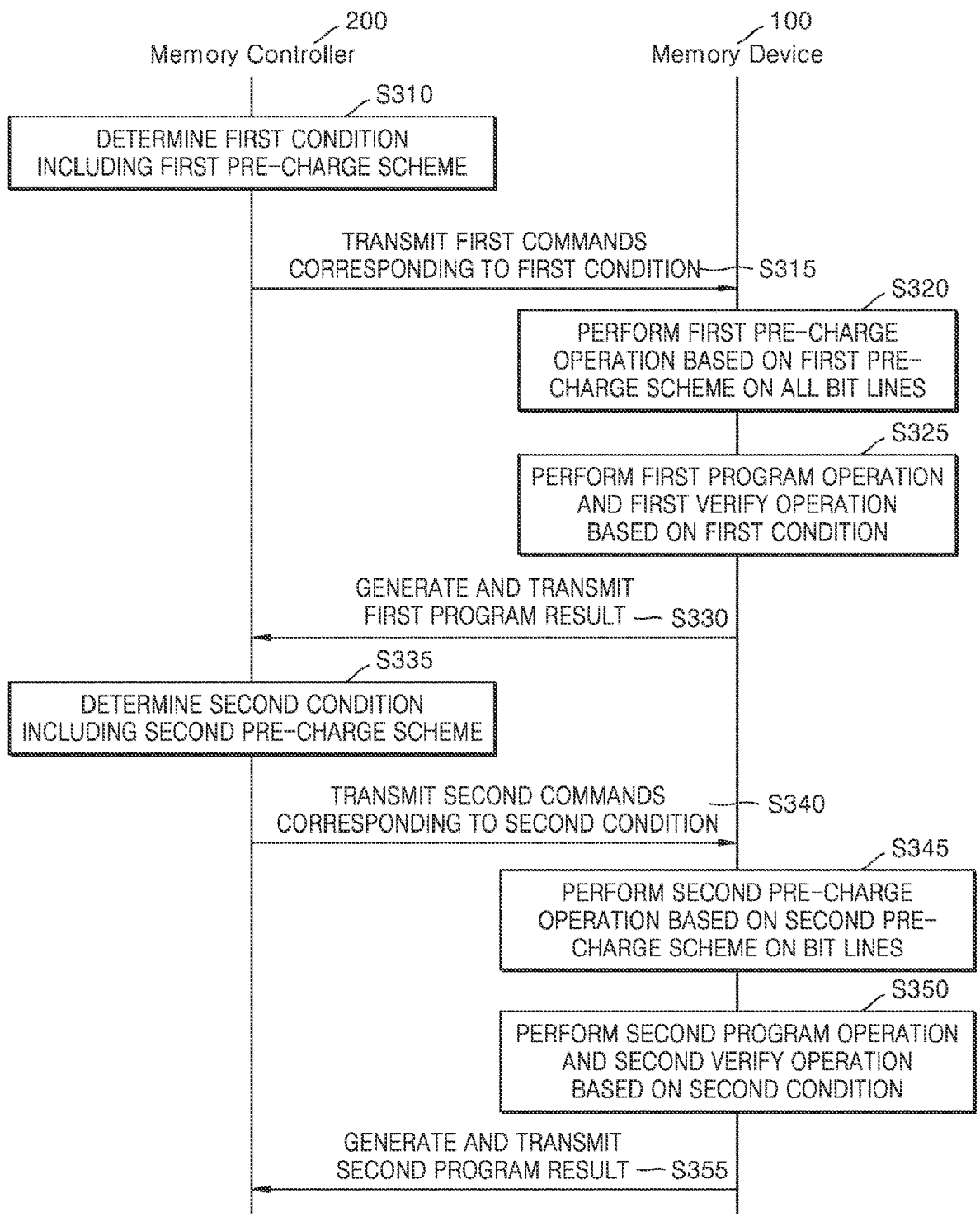
FIG. 16 is a flowchart of a method according to an embodiment of the inventive concept.

FIG. 16 is a flowchart of a method according to an embodiment of the inventive concept.

Referring to FIG. 16, a method according to an embodiment of the inventive concept may include a general pre-charge operation of pre-charging the plurality of bit lines BL and a selective pre-charge operation of pre-charging bit lines of the plurality of bit lines BL to be verified. The general pre-charge operation may be useful in terms of providing a reliable threshold voltage distribution, because the first pre-charge operation may be similar to a read operation performed by the memory device 100. However, since all of the plurality of bit lines are pre-charged by the first pre-charge operation, current levels may not be properly managed in the memory device 100. On the other hand, the selective pre-charge operation may be useful for managing the current levels in the memory device 100, but may provide a less reliable threshold voltage distribution. However, the inventive concept is not limited thereto. Detailed descriptions of previously described operations will be omitted.

According to an embodiment of the inventive concept, by controlling the first pre-charge, program, and verify operation under different conditions than the second pre-charge, program, and verify operation, the memory device 100 may improve a threshold voltage distribution in the memory cell array 110. According to an embodiment illustrated by FIG. 16, the memory controller 200 may control the pre-charge, program, and verify operations performed by the memory device 100. However, the inventive concept is not limited thereto, and operations performed by the memory controller 200 may be performed by the program controller 201, the control logic 160, or the program logic 161 in embodiments.

The memory controller 200 may determine a first condition including a first pre-charge scheme (S310). As illustrated by FIG. 16, the first pre-charge scheme is a general pre-charge scheme. However, the inventive concept is not limited thereto. The first pre-charge scheme may be a general pre-charge scheme, a selective pre-charge scheme, or various other pre-charge schemes. The memory controller 200 may provide the memory device 100 with the first condition including the first pre-charge scheme by transmitting a first program command and a first verify command corresponding to the first condition to the memory device 100 (S315). According to an embodiment, the memory device 100 may be implemented as a non-volatile memory device (NVM).

The memory device 100 may perform a first pre-charge operation based on the first pre-charge scheme (S320). As illustrated in FIG. 16, the memory device may perform a general pre-charge operation to pre-charge the plurality of bit lines BL. However, the inventive concept is not limited thereto. The memory device 100 may perform a first program operation and a first verify operation based on the first condition (S325). In the embodiment, the first program operation and the first verify operation may be performed separately or may be performed concurrently. The memory device 100 may then generate and transmit a first program result based on the first program operation and the first verify operation to the memory controller 200 (S330).

The memory controller 200 may determine a second condition including a second pre-charge scheme based on the first program result (S335). The memory controller 200 may provide the memory device 100 with the second condition including the second pre-charge scheme by transmitting a second program command and a second verify command corresponding to the second condition to the memory device 100 (S340).

The memory device 100 may perform a second pre-charge scheme based on the second pre-charge scheme (S345). Although FIG. 16 illustrates the second pre-charge scheme to be a selective pre-charge scheme, the inventive concept is not limited thereto. The memory device 100 may perform a second program operation and a second verify operation based on the second condition (S350). In an embodiment, the second program operation and the second verify operation may be performed separately or concurrently. The memory device 100 may then generate and transmit a second program result based on the second program operation and the second verify operation to the memory controller 200 (S355).

According to FIG. 16, voltages provided to bit lines may be different from each other when the first pre-charge scheme is different from the second pre-charge scheme. For example, in a selective pre-charge scheme, a logic low signal or a low-level voltage may be applied to bit lines that will not be verified. According to the inventive concept, this may further enhance a threshold voltage distribution of the memory cell array 110, as compared to an instance where a same pre-charge is used for the first and second pre-charge schemes.

Figure 17:
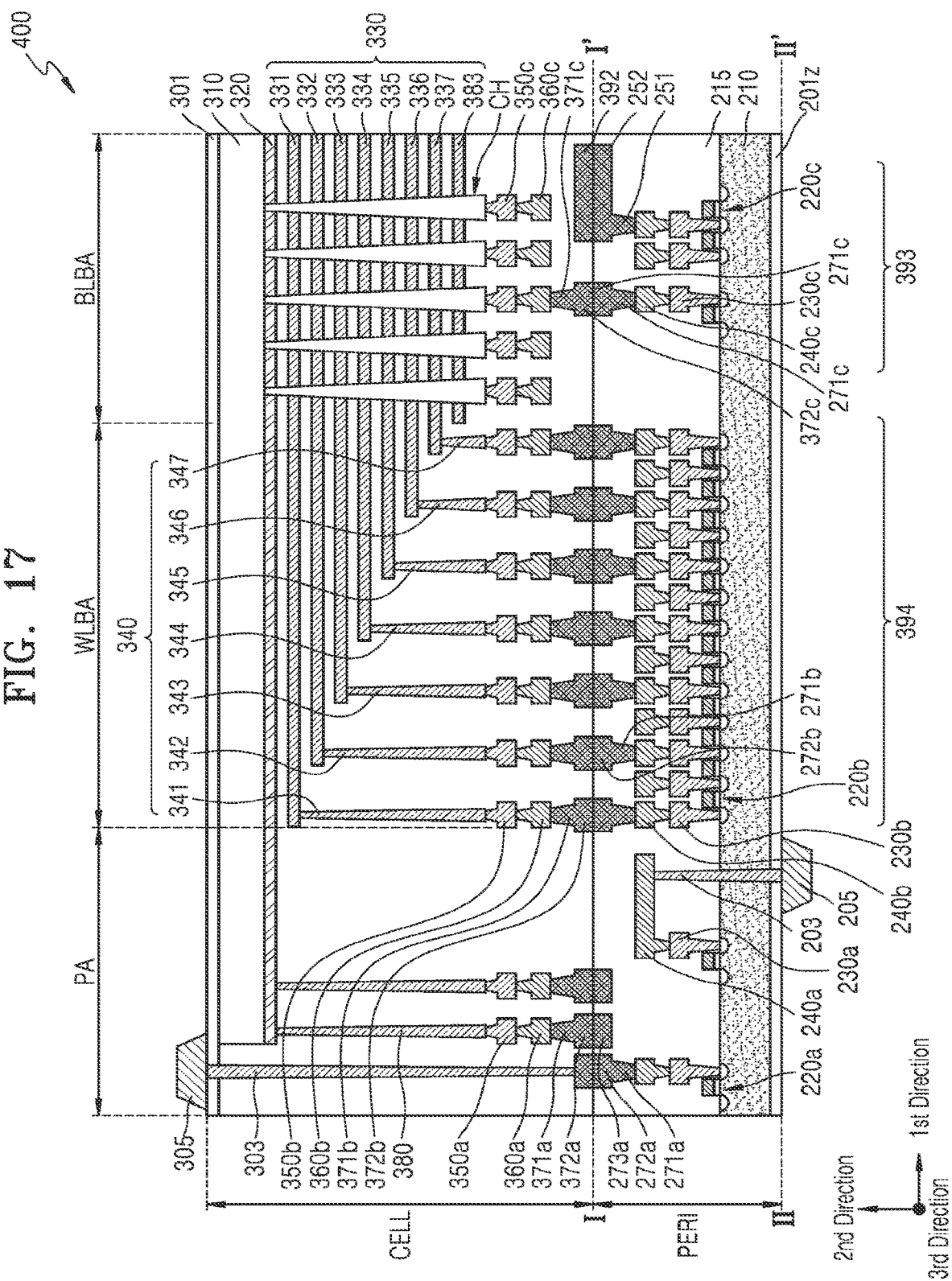
FIG. 17 is a cross-sectional view of a memory device 400 according to an embodiment of the inventive concept.

FIG. 17 is a cross-sectional view of a memory device 400 according to an embodiment of the inventive concept. The memory device 400 may be interchangeable with the memory device 100 in embodiments of the inventive concept.

Referring to FIG. 17, the memory device 400 may have a chip-to-chip (C2C) structure. The C2C structure may refer to a structure formed by manufacturing an upper chip including a cell region CELL on a first wafer, manufacturing a lower chip including a peripheral circuit region PERI on a second wafer which is separate from the first wafer, and then bonding the upper chip and the lower chip to each other. Here, the bonding process may include a method of electrically connecting a bonding metal formed on an uppermost metal layer of the upper chip and a bonding metal formed on an uppermost metal layer of the lower chip. The bonding metals may include a material such as copper (Cu), aluminum (Al), tungsten (W), or any other suitable material or combination thereof.

Each of the peripheral circuit region PERI and the cell region CELL may include an external pad bonding area PA, a word line bonding area WLBA, and a bit line bonding area BLBA.

The peripheral circuit region PERI may include a first substrate 210, an interlayer insulating layer 215, a plurality of circuit elements 220a, 220b, and 220c formed on the first substrate 210, first metal layers 230a, 230b, and 230c respectively connected to the plurality of circuit elements 220a, 220b, and 220c, and second metal layers 240a, 240b, and 240c formed on the first metal layers 230a, 230b, and 230c. In an embodiment, the first metal layers 230a, 230b, and 230c may be formed of tungsten and may consequently have a relatively high electrical resistivity, and the second metal layers 240a, 240b, and 240c may be formed of copper, and may consequently have a relatively low electrical resistivity.

Although only the first metal layers 230a, 230b, and 230c and the second metal layers 240a, 240b, and 240c are shown in FIG. 17, the inventive concept is not limited thereto, and one or more additional metal layers may be further formed on the second metal layers 240a, 240b, and 240c. At least a portion of the one or more additional metal layers formed on the second metal layers 240a, 240b, and 240c may be formed of aluminum or the like, and may consequently have a lower electrical resistivity than a portion of the one or more additional metal layers which may be formed of copper or the like.

The interlayer insulating layer 215 may be disposed on the first substrate 210 and may at least partially cover the plurality of circuit elements 220a, 220b, and 220c, the first metal layers 230a, 230b, and 230c, and the second metal layers 240a, 240b, and 240c. The interlayer insulating layer 215 may include an insulating material such as silicon oxide, silicon nitride, or the like.

Lower bonding metals 271b and 272b may be formed on the second metal layer 240b in the word line bonding area WLBA. In the word line bonding area WLBA, the lower bonding metals 271b and 272b in the peripheral circuit region PERI may be electrically bonded to upper bonding metals 371b and 372b of the cell region CELL. The lower bonding metals 271b and 272b and the upper bonding metals 371b and 372b may be formed of aluminum, copper, tungsten, or the like. Further, the upper bonding metals 371b and 372b in the cell region CELL may be referred to as first metal pads and the lower bonding metals 5271b and 5272b in the peripheral circuit region PERI may be referred to as second metal pads.

The cell region CELL may include at least one memory block. The cell region CELL may include a second substrate 310 and a common source line 320. On the second substrate 310, a plurality of word lines 330 including word lines 331 to 338 may be stacked in a second direction perpendicular to an upper surface of the second substrate 310, which may extend in a first direction. At least one string select line and at least one ground select line may be arranged on and below the plurality of word lines 330, respectively, and the plurality of word lines 330 may be disposed between the at least one string select line and the at least one ground select line.

In the bit line bonding area BLBA, a channel structure CH may extend in the second direction and may pass through the plurality of word lines 330, the at least one string select line, and the at least one ground select line. The channel structure CH may include a data storage layer, a channel layer, a buried insulating layer, and/or the like, and the channel layer may be electrically connected to a first metal layer 350c and a second metal layer 360c. For example, the first metal layer 350c may be a bit line contact, and the second metal layer 360c may be a bit line. In an embodiment, the bit line 360c may extend in third direction intersecting the first and second directions.

As illustrated by FIG. 17, an area in which the channel structure CH, the bit line 360c, and the like are disposed may be defined as the bit line bonding area BLBA. In the bit line bonding area BLBA, the bit line 360c may be electrically connected to the circuit elements 220c, providing a page buffer 393 in the peripheral circuit region PERI. The bit line 360c may be connected to upper bonding metals 371c and 372c in the cell region CELL, and the upper bonding metals 371c and 372c may be connected to lower bonding metals 271c and 272c connected to the circuit elements 220c of the page buffer 393.

In the word line bonding area WLBA, the plurality of word lines 330 may extend in the first direction and may be connected to a plurality of cell contact plugs 340, including cell contact plugs 341 to 347. The plurality of word lines 330 and the plurality of cell contact plugs 340 may be connected to each other in pads provided by at least a portion of the plurality of word lines 330 extending in different lengths in the second direction. A first metal layer 350b and a second metal layer 360b may be connected to an upper portion of the plurality of cell contact plugs 340 connected to the plurality of word lines 330, sequentially. The plurality of cell contact plugs 340 may be connected to the peripheral circuit region PERI by the upper bonding metals 371b and 372b of the cell region CELL and the lower bonding metals 271b and 272b of the peripheral circuit region PERI in the word line bonding area WLBA.

The plurality of cell contact plugs 340 may be electrically connected to the circuit elements 220b, forming a row decoder 394 in the peripheral circuit region PERI. In an embodiment, operating voltages of the circuit elements 220b of the row decoder 394 may be different than operating voltages of the circuit elements 220c forming the page buffer 393. For example, the operating voltages of the circuit elements 220c forming the page buffer 393 may be greater than the operating voltages of the circuit elements 220b forming the row decoder 394.

A common source line contact plug 380 may be disposed in the external pad bonding area PA. The common source line contact plug 380 may be formed of a conductive material such as a metal, a metal compound, polysilicon, or the like, and may be electrically connected to the common source line 320. A first metal layer 350a and a second metal layer 360a may be stacked on an upper portion of the common source line contact plug 380, sequentially. For example, an area in which the common source line contact plug 380, the first metal layer 350a, and the second metal layer 360a are disposed may be defined as the external pad bonding area PA.

First and second input-output pads 205 and 305 may be disposed in the external pad bonding area PA. Referring to FIG. 17, a lower insulating film 201z covering a lower surface of the first substrate 210 may be formed below the first substrate 210, and a first input-output pad 205 may be formed on the lower insulating film 201z. The first input-output pad 205 may be connected to at least one of the plurality of circuit elements 220a, 220b, and 220c disposed in the peripheral circuit region PERI through a first input-output contact plug 203, and may be separated from the first substrate 210 by the lower insulating film 201z. In addition, a side insulating film may be disposed between the first input-output contact plug 203 and the first substrate 210 to electrically separate the first input-output contact plug 203 and the first substrate 210.

Referring to FIG. 17, an upper insulating film 301 may be formed on the second substrate 310 and may at least partially cover the second substrate 310, and a second input-output pad 305 may be disposed on the upper insulating film 301. The second input-output pad 305 may be connected to at least one of the plurality of circuit elements 220a, 220b, and 220c disposed in the peripheral circuit region PERI through a second input-output contact plug 303. In the embodiment, the second input-output pad 305 may be electrically connected to a circuit element 220a.

According to an embodiment, the second substrate 310 and the common source line 320 may be omitted from an area in which the second input-output contact plug 303 is disposed. Also, the second input-output pad 305 might not overlap the word lines 330 in the second direction. Referring to FIG. 17, the second input-output contact plug 303 may be spaced apart from the second substrate 310 in the first direction and may pass through the interlayer insulating layer 315 of the cell region CELL to be connected to the second input-output pad 305.

According to an embodiment, the first input-output pad 205 and the second input-output pad 305 may be selectively formed. For example, the memory device 400 may include only the first input-output pad 205 disposed on the first substrate 210 or may include only the second input-output pad 305 disposed on the second substrate 310. Alternatively, the memory device 400 may include both the first input-output pad 205 and the second input-output pad 305.

A metal pattern provided on an uppermost metal layer may be provided as a dummy pattern, or the uppermost metal layer may be omitted, in each of the external pad bonding area PA and the bit line bonding area BLBA.

In the external pad bonding area PA, the memory device 400 may include a lower metal pattern 273a corresponding to an upper metal pattern 372a formed in an uppermost metal layer of the cell region CELL and having the same cross-sectional shape as the upper metal pattern 372a of the cell region CELL so as to be connected to each other in an uppermost metal layer of the peripheral circuit region PERI. In the peripheral circuit region PERI, the lower metal pattern 273a formed in the uppermost metal layer of the peripheral circuit region PERI might not be connected to a contact. Similarly, in the external pad bonding area PA, an upper metal pattern 372a corresponding to the lower metal pattern 273a formed in an uppermost metal layer of the peripheral circuit region PERI and having the same shape as a lower metal pattern 273a of the peripheral circuit region PERI may be formed in an uppermost metal layer of the cell region CELL.

The lower bonding metals 271b and 272b may be formed on the second metal layer 240b in the word line bonding area WLBA. In the word line bonding area WLBA, the lower bonding metals 271b and 272b of the peripheral circuit region PERI may be electrically connected to the upper bonding metals 371b and 372b of the cell region CELL by a copper-to-copper (Cu-to-Cu) bonding.

Furthermore, in the bit line bonding area BLBA, an upper metal pattern 392 corresponding to a lower metal pattern 252 formed in the uppermost metal layer of the peripheral circuit region PERI and having the same cross-sectional shape as the lower metal pattern 252 of the peripheral circuit region PERI may be formed in an uppermost metal layer of the cell region CELL. A contact might not be formed on the upper metal pattern 392 formed in the uppermost metal layer of the cell region CELL.

In an embodiment, a reinforcement metal pattern corresponding to a metal pattern formed in an uppermost metal layer in one of the cell region CELL and the peripheral circuit region PERI and having the same cross-sectional shape as the metal pattern may be formed in an uppermost metal layer in the other one of the cell region CELL and the peripheral circuit region PERI. A contact might not be formed on the reinforcement metal pattern.

Figure 18:
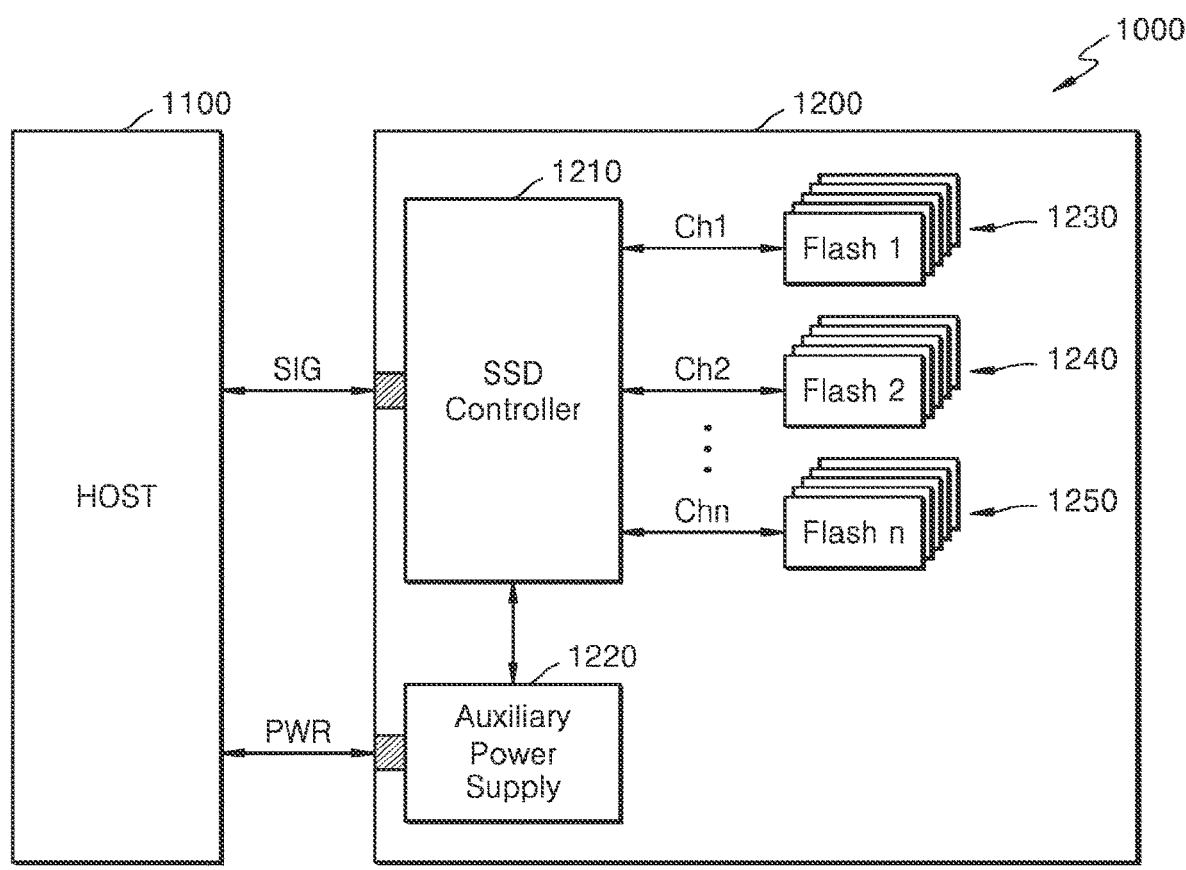
FIG. 18 is a block diagram of a solid state drive (SSD) system 1000 including memory devices according to embodiments of the inventive concept.

FIG. 18 is a block diagram of a solid state drive (SSD) system 1000 including memory devices according to the inventive concept.

Referring to FIG. 18, an SSD system 1000 may include a host 1100 and an SSD 1200. The SSD 1200 may exchange signals with the host 1100 through a signal connector and may receive power through a power connector. The SSD 1200 may include an SSD controller 1210, an auxiliary power supply device 1220, and a plurality of memory devices 1230, 1240, and 1250. The memory devices 1230, 1240, and 1250 may be vertically stacked NAND flash memory devices. Here, the SSD 1200 may be implemented according to embodiments described above with reference to FIGS. 1 to 18.

While embodiments of the inventive concept has been described with reference to accompanying drawings, it will be understood that various changes in form and details may be made therein without departing from the spirit and scope of the inventive concept.

What is claimed is:

1. A method for programming a non-volatile memory device, the method comprising:
    determining a first condition comprising a first and second program voltage and a first and second adjacent voltage;
    performing a first program operation by providing the first and second program voltage to a selected word line connected to at least one selected memory cell and providing the first and second adjacent voltage to word lines immediately adjacent to the selected word line according to the first condition;
    determining a second condition comprising a third and fourth program voltage and a third and fourth adjacent voltage based on a result of the first program operation, wherein the third program voltage is different from the first program voltage, the fourth program voltage is different from the second program voltage, the third adjacent voltage is different from the first adjacent voltage, and the fourth adjacent voltage is different from the second adjacent voltage; and
    performing a second program operation by providing the third and fourth program voltage to the selected word line and providing the third and fourth adjacent voltage to the word lines immediately adjacent to the selected word line according to the second condition,
    wherein the second adjacent voltage is higher than the first adjacent voltage by a first adjacent voltage increment, the fourth adjacent voltage is higher than the third adjacent voltage by a second adjacent voltage increment, and the second adjacent voltage increment is smaller than the first adjacent voltage increment.

2. The method of claim 1, wherein the non-volatile memory device comprises:
    a substrate;
    a memory cell region including a first metal pad and a plurality of memory cells formed perpendicularly to the substrate, wherein the plurality of memory cells are connected to a plurality of word lines comprising the word line and to a plurality of bit lines comprising the bit line; and
    a peripheral circuit region including a second metal pad and a voltage generator configured to generate the at least one voltage, wherein the peripheral circuit region is connected to the plurality of memory cells through the first metal pad and the second metal pad.

3. The method of claim 1, wherein:
    the third program voltage is higher than the first program voltage; and
    the fourth program voltage is higher than the second program voltage.

4. The method of claim 1, wherein:
    the third adjacent voltage is higher than the first adjacent voltage; and
    the fourth adjacent voltage is higher than the second adjacent voltage.

5. The method of claim 1, further comprising:
    performing the first program operation by further providing a fifth adjacent voltage to the word lines immediately adjacent to the selected word line, wherein the fifth adjacent voltage is higher than the second adjacent voltage by the first adjacent voltage increment;
    determining that the second condition further comprises a sixth adjacent voltage different from the fifth adjacent voltage based on the result of the first program operation; and
    performing the second program operation by further providing the sixth adjacent voltage to the word lines immediately adjacent to the selected word line, wherein the sixth adjacent voltage is higher than the fourth adjacent voltage by the second adjacent voltage increment.

6. The method of claim 1, wherein:
    a first threshold voltage of the selected memory cell according to the result of the first program operation is lower than a second threshold voltage corresponding to the first threshold voltage of the selected memory cell according to a result of the second program operation.

7. The method of claim 1, wherein:
    a number of states corresponding to a threshold voltage distribution of the selected memory cell according to the result of the first program operation is equal to a number of states corresponding to a threshold voltage distribution of the selected memory cell according to a result of the second program operation.

8. The method of claim 1, wherein:
    a number of states corresponding to a threshold voltage distribution of the selected memory cell according to the result of the first program operation is equal to a number of states corresponding to a final threshold voltage distribution of the selected memory cell.

9. The method of claim 1, wherein:
    the second program voltage is higher than the first program voltage by a first program increment value;
    the fourth program voltage is higher than the third program voltage by a second program increment value; and
    the second program increment value is lower than the first program increment value.

10. The method of claim 9, wherein:
a width of a threshold voltage distribution according to the result of the first program operation corresponds to the first program increment value; and
a width of a threshold voltage distribution according to the result of the second program operation corresponds to the second program increment value.

11. The method of claim 1, further comprising:
performing the first program operation during a first application time and the second program operation during a second application time,
wherein the second application time is different from the first application time and is determined based on the result of the first program operation.

12. A non-volatile memory device comprising:
a substrate;
a memory cell region comprising a first metal pad and a memory cell array comprising a plurality of cell strings, a plurality of string select lines, and a plurality of word lines, the plurality of cell strings comprising a plurality of memory cells formed perpendicularly to the substrate, wherein the plurality of string select lines are respectively connected to the plurality of memory cells, and the plurality of word lines are respectively connected to the plurality of memory cells; and
a peripheral circuit region comprising:
 a second metal pad;
 a control logic configured to control a first program operation and a second program operation for the memory cell array by providing a control signal and an address signal;
 a voltage generator configured to generate at least one voltage based on the control signal;
 a row decoder configured to provide a first and second program voltage and a first and second adjacent voltage to the memory cell array during the first program operation and to provide a third and fourth program voltage and third and fourth adjacent voltage to the memory cell array during the second program operation; and
 control logic configured to adjust the third and fourth program voltage, the third and fourth adjacent voltage, and an application time for the second program operation based on a result of the first program operation, wherein the third program voltage is different from the first program voltage, the fourth program voltage is different from the second program voltage, the third adjacent voltage is different from the first adjacent voltage, and the fourth adjacent voltage is different from the second adjacent voltage,
wherein the peripheral circuit region is connected to the memory cell region through the first metal pad and the second metal pad,
wherein the first program voltage, the second program voltage, the third program voltage, and the fourth program voltage are provided to at least one memory cell included in the memory cell array through a selected word line, and
wherein the first adjacent voltage, the second adjacent voltage, the third adjacent voltage, and the fourth adjacent voltage are provided to the at least one memory cell through word lines immediately adjacent to the selected word line.

13. The non-volatile memory device of claim 12, wherein:
the memory cell region is formed on a first wafer; and
the peripheral circuit region is formed on a second wafer.

14. The non-volatile memory device of claim 12, wherein:
the third adjacent voltage is higher than the first adjacent voltage; and
the fourth adjacent voltage is higher than the second adjacent voltage.

15. The non-volatile memory device of claim 12, wherein:
the second adjacent voltage is higher than the first adjacent voltage by a first adjacent voltage increment;
the fourth adjacent voltage is higher than the third adjacent voltage by a second adjacent voltage increment;
the second adjacent voltage increment is lower than the first adjacent voltage increment; and
the row decoder is further configured to:
 provide a fifth adjacent voltage to word lines immediately adjacent to the selected word line during the first program operation, wherein the fifth adjacent voltage is higher than the second adjacent voltage by the first adjacent voltage increment, and
 provide a sixth adjacent voltage to word lines immediately adjacent to the selected word line during the second program operation, wherein the sixth adjacent voltage is higher than the fourth adjacent voltage by the second adjacent voltage increment.

16. The non-volatile memory device of claim 12, wherein:
a first threshold voltage distribution of the selected memory cell according to the result of the first program operation is lower than a second threshold voltage distribution corresponding to the first threshold voltage distribution of the selected memory cell according to a result of the second program operation.

17. The non-volatile memory device of claim 12, wherein:
a number of states corresponding to a threshold voltage distribution of the selected memory cell according to the result of the first program operation is equal to a number of states corresponding to a threshold voltage distribution of the selected memory cell according to a result of the second program operation.

18. The non-volatile memory device of claim 12, wherein:
a number of states corresponding to a threshold voltage distribution of the selected memory cell according to the result of the first program operation is equal to a number of states corresponding to a final threshold voltage distribution of the selected memory cell.

19. The non-volatile memory device of claim 12, wherein:
the second program voltage is higher than the first program voltage by a first program increment value;
the fourth program voltage is higher than the third program voltage by a second program increment value;
the second program increment value is lower than the first program increment value;
a width of a threshold voltage distribution according to the result of the first program operation corresponds to the first program increment value; and
a width of a threshold voltage distribution according to the result of the second program operation corresponds to the second program increment value.

* * * * *